United States Patent
Nagata et al.

[11] Patent Number: 5,999,041
[45] Date of Patent: Dec. 7, 1999

[54] LOAD ACTUATION CIRCUIT

[75] Inventors: Junichi Nagata; Junji Hayakawa, both of Okazaki; Hiroyuki Ban, Aichi-ken, all of Japan

[73] Assignee: Denso Corporation, Kariya, Japan

[21] Appl. No.: 08/857,881

[22] Filed: May 16, 1997

[30] Foreign Application Priority Data

| May 17, 1996 | [JP] | Japan | 8-123667 |
| Nov. 13, 1996 | [JP] | Japan | 8-301926 |
| Jan. 6, 1997 | [JP] | Japan | 9-000331 |

[51] Int. Cl.$^6$ .................................................. H03K 17/08
[52] U.S. Cl. .......................... 327/538; 327/540; 327/541; 327/108; 361/91
[58] Field of Search .................................. 327/538, 540, 327/541, 542, 543, 480, 108; 361/91

[56] References Cited

U.S. PATENT DOCUMENTS

| 4,553,084 | 11/1985 | Wrathall | 323/312 |
| 4,618,816 | 10/1986 | Monticelli | 323/316 |
| 4,810,902 | 3/1989 | Storti | 307/446 |
| 4,893,158 | 1/1990 | Mihara et al. | 357/23.13 |
| 5,081,379 | 1/1992 | Korteling | 327/50 |
| 5,177,659 | 1/1993 | Zisa et al. | 361/103 |
| 5,473,276 | 12/1995 | Throngnumchai | 327/432 |
| 5,481,179 | 1/1996 | Keeth | 323/315 |
| 5,656,968 | 8/1997 | Sander et al. | 327/543 |

FOREIGN PATENT DOCUMENTS

| 5-235365 | 9/1993 | Japan . |
| 5-327442 | 12/1993 | Japan . |
| 7-52370 | 6/1995 | Japan . |

*Primary Examiner*—Timothy P. Callahan
*Assistant Examiner*—An T. Luu
*Attorney, Agent, or Firm*—Pillsbury Madison & Sutro LLP

[57] ABSTRACT

An output MOS transistor and a current-detecting MOS transistor are connected commonly at their drains and gates. A gate voltage is fed to the gates of these transistors via signal lines. When the voltage of an output terminal is increased in response to excessive load current, a current-mirror circuit consisting of first and second transistors pulls in current from the signal line to reduce the gate voltage. Thus, the output current of output MOS transistor is limited within a predetermined level. Furthermore, a diode, provided in the signal line, produces a voltage drop equivalent to the base-emitter voltage of first transistor. By the function of this diode, the gate-source voltage of output MOS transistor is equalized with the gate-source voltage of current-detecting MOS transistor. As a result, the same operating point can be set for the output transistor and the current-detecting transistor.

34 Claims, 13 Drawing Sheets

1 : ELECTRICAL LOAD
2 : OUTPUT MOS TRANSISTOR
3 : CURRENT-DETECTING MOS TRANSISTOR
100 : CURRENT-MIRROR CIRCUIT
200 : GATE ACTUATION CIRCUIT

LOAD ACTUATION CIRCUIT

BACKGROUND OF THE INVENTION

1. Field of the Invention

The invention relates to a load actuation circuit used for actuating or driving an electrical load, and more particularly to a load actuation circuit having a function of limiting the load current supplied to the electrical load within a predetermined value or a function of protecting the load actuation circuit against excessive load current.

2. Related Art

Laid-open Japanese Patent Application No. 5-327442 discloses a conventional load actuation circuit that has a function of limiting the load current when the load current becomes an excessive value.

According to the load actuation circuit disclosed in this prior art, an output MOS transistor is provided to supply load current to an electrical load. The drain and gate terminals of this output MOS transistor are connected respectively to the drain and gate terminals of a current-detecting MOS transistor. A current-controlling NPN transistor is connected to the source of the current-detecting transistor. When the load current flowing across the output MOS transistor becomes an excessive value, the gate voltage applied to both of the output MOS transistor and the current-detecting MOS transistor is suppressed by the control of this NPN transistor. Thus, the current flowing across the output MOS transistor is limited within a predetermined value.

However, according to the above-described conventional arrangement, only one NPN transistor is used to perform a current-limit operation to suppress the excessive load current. Accordingly, there is a problem that the temperature characteristics of the NPN transistor may deteriorate the accuracy in the current-limit operation.

Provision of the NPN transistor causes a difference between the gate-source voltage of the output MOS transistor and the gate-source voltage of the current-detecting MOS transistor. Such a difference usually differentiates the operating point of the output MOS from the operating point of the current-detecting MOS transistor. This possibly results in an unstable current-detecting operation.

SUMMARY OF THE INVENTION

In view of the above-described problems, the present invention has an object to provide a load actuation circuit having a novel arrangement including a current-mirror circuit for performing a reliable current detection.

Another object of the present invention is to limit the load current accurately based on the current detection using the current-mirror circuit.

Still another object of the present invention is to perform an intermittent control of the load current based on the current detection using the current-mirror circuit.

Moreover, another object of the present invention is to assure an accuracy in the current control and provide a load actuation circuit robust against temperature change.

Yet further, another object of the present invention is to set the same operating point for both of the output transistor and the current-detecting transistor to stabilize the current-detecting operation.

In order to accomplish this and other related objects, the present invention provides a load actuation circuit having various aspects will be described hereinafter in the preferred embodiments of the present invention.

One aspect of the present invention provides a load actuation circuit comprises an output transistor supplying load current to an electrical load. A current-detecting transistor is connected in parallel with the output transistor. A control terminal of the current-detecting transistor is connected to a control terminal of the output transistor. A control signal is fed from signal line to the control terminals of the output transistor and the current-detecting transistor via a resistor. A first transistor is connected in series with the current-detecting transistor. A second transistor is associated with the first transistor to constitute a current-mirror circuit. And, this current-mirror circuit is responsive to part of the load current flowing across the first transistor via the current-detecting transistor and allows current flowing across the second transistor by a predetermined ratio with respect to the part of the load current flowing across the first transistor. With this arrangement, the voltage level of the control signal fed to the output transistor and the current-detecting transistor varies in response to a voltage change occurring at the resistor in accordance with the current flowing across the signal line, so that the load current is limited within a predetermined level.

The current-mirror circuit is advantageous in that the first and second transistors constituting the current-mirror circuit mutually cancel their temperature characteristics. Thus, the current-limit operation is performed accurately no matter how the temperature varies.

In this case, the current-limit operation can be used in protecting the load actuation circuit against an excessive current, or in a constant-current control for suppressing the load current to a constant current.

Preferably, the output transistor is an output MOS transistor having a drain and a gate connected respectively to a drain and a gate of a current-detecting MOS transistor serving as the current-detecting transistor. And, the first transistor is connected to a source of the current-detecting MOS transistor.

Preferably, both of the output MOS transistor and the current-detecting MOS transistor are N-channel type MOS transistors that cooperatively act to pull in the current from the signal line to the second transistor.

Alternatively, both of the output MOS transistor and the current-detecting MOS transistor are P-channel type MOS transistors that cooperatively act to send out the current from the second transistor to the signal line.

Accordingly, in any cases, a voltage change occurs depending on the current flowing across the resistor. The control signal varies its voltage level. Thus, the load current can be limited within a predetermined value.

Preferably, the first and second transistors of the current-mirror circuit are constituted by first and second bipolar transistors connected commonly at their bases as well as their emitters. The collector of the first bipolar transistor is connected to the source of the current-detecting MOS transistor and the common base. The emitter of the first bipolar transistor is connected to the source of the output MOS transistor, while the collector of the second bipolar transistor is connected to the signal line.

In this case, it is preferable that the signal line comprises a first signal line feeding the control signal to the gate of the current-detecting MOS transistor via the resistor and a second signal line feeding the control signal to the gate of the output MOS transistor from an intermediate point between the gate of the current-detecting MOS transistor and the resistor. Furthermore, voltage drop means provided in the second signal line to cause a voltage drop substantially identical with a base-emitter voltage of the first bipolar transistor. With this arrangement, it becomes possible to set substantially the same gate-source voltage for both of the output MOS transistor and the current-detecting MOS transistor. The operating point can be equalized or synchronized for both of the output MOS transistor and the current-detecting MOS transistor. The current-detecting operation can be stabilized.

Preferably, the voltage drop means is a semiconductor element generating a forward voltage by using a PN junction.

It is also preferable that the first and second transistors of the current-mirror circuit are constituted by first and second MOS transistors (14, 15) connected commonly at their gates as well as sources. The drain of the first MOS transistor is connected to the source of the current-detecting MOS transistor and the common gate. The source of the first MOS transistor is connected to the source of the output transistor, while the drain of the second MOS transistor is connected to the signal line.

In this case, the signal line comprises a first signal line feeding the control signal to the gate of the current-detecting MOS transistor via the resistor and a second signal line feeding the control signal to the gate of the output MOS transistor from an intermediate point between the gate of the current-detecting MOS transistor and the resistor. The voltage drop means (18) is provided in the second signal line to cause a voltage drop substantially identical with a gate-source voltage of the first MOS transistor. With this arrangement, it becomes possible to set substantially the same gate-source voltage for both of the output MOS transistor and the current-detecting MOS transistor. The operating point can be equalized or synchronized for both of the output MOS transistor and the current-detecting MOS transistor. The current-detecting operation can be stabilized.

Preferably, the voltage drop means is a MOS transistor capable of causing the voltage drop equivalent to its gate-source voltage when its drain and gate are short-circuited.

Furthermore, it is preferable to provide discharge means for discharging the gate of the output MOS transistor when the output MOS transistor is turned off. This arrangement is effective to assure the operation in discharging the gate of the output MOS transistor even when the voltage-drop means is constituted by the semiconductor or MOS transistor described above.

Moreover, it is preferable that the load actuation circuit of the present invention further comprises a third transistor and an intermitted control circuit. The third transistor constitutes a current-mirror circuit together with the first and second transistors. The intermittent control circuit is responsive to the current flowing across the third transistor to detect the load current, and having a function of turning off both of the output transistor and the current-detecting transistor in response to a detection of excessive load current, while tuning on both of the output transistor and the current-detecting transistor in response to an elimination of the excessive load current.

Accordingly, the output transistor is no longer subjected to the loss derived from excessive load current, because the output transistor is turned off in response to the excessive load current.

Preferably, the intermittent control circuit comprises a delay circuit that turns off both of the output transistor and the current-detecting transistor in response to an elapse of a predetermined time after the detection of the excessive load current. This arrangement is effective to prevent the output transistor from being turned off erroneously in response to rush current flowing across the electrical load at the beginning of the actuation of this electrical load.

Another aspect of the present invention provides a load actuation circuit comprising an output transistor having a control terminal as well as one and other terminals for inputting and outputting current, to supply load current to an electrical load, and a current-detecting transistor having a control terminal as well as one and other terminals for inputting and outputting current. The one terminal of the current-detecting transistor is connected to the one terminal of the output transistor. The output transistor and the current-detecting transistor respectively perform a current-supply operation in response to a control voltage fed between the control terminal and the other terminal thereof. A first signal line feeds a control signal to the control terminal of the current-detecting transistor via a resistor. A second signal line feeds the control signal to the control terminal of the current-detecting transistor from an intermediate point between the resistor and the control terminal of the current-detecting transistor. Furthermore, a current-control transistor is connected in series with the current-detecting transistor, so that the current-control transistor and the current-detecting transistor are connected in parallel with the output transistor. The current-control transistor allows part of the load current to flow across the current-detecting transistor as a detection current when the load current exceeds a predetermined value. A current-limiting circuit includes the current-control transistor and varies the voltage level of the control signal in response to an operation of the current-control transistor, to limit the load current within a predetermined level. And, voltage-drop means is provided in the second signal line for causing a voltage drop substantially identical with a voltage applied between the other terminal of the current-detecting transistor and the other terminal of the output transistor when the current-control transistor is operated.

Accordingly, it becomes possible to set substantially the same control voltage applied between the control terminal and the above-described other terminal for both of the output transistor and the current-detecting transistor. The operating point can be equalized or synchronized for both of the output transistor and the current-detecting transistor. The current-detecting operation can be stabilized.

Preferably, the current-control transistor is a bipolar transistor, and the voltage-drop means is a semiconductor element generating a forward voltage by using a PN junction. Alternatively, the current-control transistor is a MOS transistor, and the voltage-drop means is a MOS transistor having a gate-source voltage generating the voltage drop equivalent to its gate-source voltage when its drain and date are short-circuited.

Still another aspect of the present invention provides a load actuation circuit comprising an output transistor supplying load current to an electrical load. A current-detecting transistor is connected in parallel with the output transistor. The control terminal of the current-detecting transistor is connected to the control terminal of the output transistor. A first transistor is connected in series with the current-detecting transistor. And, a second transistor is associated with the first transistor to constitute a current-mirror circuit. With this arrangement, a control signal supplied to the output transistor is changed in response to the current flowing across the second transistor, so that the output transistor is protected from excessive current.

Constituting the current-mirror circuit by a combination of first and second transistors is effective to ensure the protection of the load actuation circuit against excessive current no matter how the temperature changes.

Yet another aspect of the present invention provides a load actuation circuit comprising an output transistor supplying load current to an electrical load. A current-detecting transistor is connected in parallel with this output transistor. The control terminal of the current-detecting transistor is connected to the control terminal of the output transistor. A first transistor is connected in series with the current-detecting transistor. A second transistor is associated with the first transistor to constitute a current-mirror circuit. Furthermore, an intermittent control circuit is provided to respond to the current flowing across the second transistor to detect the load current and turn off both of the output transistor and the current-detecting transistor in response to a detection of excessive load current while turn on both of the output transistor and the current-detecting transistor in response to an elimination of the excessive load current.

Constituting the current-mirror circuit by a combination of first and second transistors is effective to ensure the protection of the load actuation circuit against excessive current no matter how the temperature varies. The output transistor is no longer subjected to the loss derived from excessive load current, because the output transistor is turned off in response to the excessive load current.

In this case, it is preferable that both of the output transistor and the current-detecting transistor are turned off in response to an elapse of a predetermined time after the detection of the excessive load current. This arrangement is effective to prevent the output transistor is turned off erroneously in response to the rush current flowing across the load at the beginning of the actuation of this load.

Preferably, a gate actuation is provided for feeding a gate voltage to the output MOS transistor and the current-detecting MOS transistor, so as to turn on and off the output MOS transistor and the current-detecting MOS transistor.

Furthermore, it is preferable that a third transistor is associated with the first and second transistors to constitute the current-mirror circuit, so that the load current flowing across the output transistor is limited within a predetermined level. According to this arrangement, the current-limiting operation is performed during the on duration of the output transistor in the protecting operation against the excessive current. Thus, heat generation can be reduced in the output transistor.

Moreover, another aspect of the present invention provides a current-limiting circuit comprising an output transistor having first and second output terminals connected in series with an electrical load between a first voltage terminal and a second voltage terminal. The second voltage terminal has an electrical potential lower than that of the first voltage terminal. The current-limiting circuit further comprises a current-detecting transistor identical in type and polarity with the output transistor. A first output terminal of this current-detecting transistor is connected to the first output terminal of the output transistor, while a control terminal of the current-detecting transistor is connected to a control terminal of the output transistor. A control signal is fed from a signal line via a resistor to the control terminals of the output transistor and the current-detecting transistor. Specifically, according to this current-limiting circuit, the second output terminal (i.e., output terminal not connected to the current-detecting transistor) of the output transistor is connected to a non-inversion input terminal of an operational amplifier. The second output terminal (i.e., output terminal not connected to the output transistor) of the current-detecting transistor is connected to an inversion input terminal of the operational amplifier. And, two output terminals of a first transistor constituting part of a current-mirror circuit are connected in series between an output terminal of the operational amplifier and the second output terminal of the current-detecting transistor.

Furthermore, the above-described current-limiting circuit comprises a second transistor associated with the first transistor to constitute the current-mirror circuit, so that current flowing across the second transistor becomes a predetermined multiple to the current flowing across the first transistor via the current-detecting transistor. A voltage change is caused at the resistor in accordance with the current flowing through the signal line by the function of the second transistor, and a voltage level of the control signal is varied in accordance with this voltage change. Thus, load current controlled by the output transistor and supplied to the electrical load is limited within a predetermined level.

This current-limiting circuit is characterized in that the operational amplifier varies its output voltage (i.e., electrical potential of the output terminal) to set the same electrical potential for the second output terminals of the output transistor and the current-detecting transistor. Current flows across the first transistor in response to the load current in a current path connecting the output terminal of the operational amplifier and the first output terminal of the current-detecting transistor.

In other words, the operational amplifier in this current-limiting circuit has a function of setting the same electrical potential difference between any two terminals for both of the output transistor and the current-detecting transistor. Accordingly, the current flowing across the current-detecting transistor is accurately proportional to the load current flowing across the output transistor. In this case, the ratio of the load current to the current flowing across the current-detecting transistor is dependent on a transistor size ratio between the current-detecting transistor and the output transistor. The current flowing across the current-detecting transistor is supplied to the first transistor.

In this respect, the operational amplifier of this current-limiting circuit is comparable with the voltage-drop means in the above-described load actuation circuit.

Current flows across the second transistor associated with the first transistor to constitute the current-mirror circuit, with the magnitude of a predetermined multiple to the current flowing across the first transistor (i.e., current flowing across the current-detecting transistor). The voltage level of the control signal is changed in accordance with the current flowing across the second transistor, and the changed control signal is fed to the control terminals of the output transistor and the current-detecting transistor. Thus, the load current controlled by the output transistor is limited within a predetermined level.

A ratio (above-described predetermined multiple) of the current flowing across the first transistor to the current flowing across the second transistor is identical with the current-mirror ratio of the current-mirror circuit determined by the transistor sizes of the first and second transistors. This ratio is equal to 1 or a value smaller than 1, and can be set adequately to any value.

According to the above-described current-limiting circuit, temperature characteristics of the first and second transistors constituting the current-mirror circuit are canceled each other. Furthermore, the output transistor and the current-detecting transistor have the same electrical potential difference for any two terminals thereof. Therefore, the present invention provides the current-limiting circuit robust against temperature change and capable of accurately performing the current-limit operation by setting the same operating point for both of the output transistor and the current-detecting transistor.

Preferably, both of the output transistor and the current-detecting transistor are constituted by N-channel type MOS transistors so as to pull in the current flowing across the second transistor from the signal line. Alternatively, it is preferable that both of the output transistor and the current-detecting transistor are constituted by P-channel type MOS transistors so as to send out the current flowing across the second transistor to the signal line. In each case, a voltage change is caused at the resistor provided in the signal line. The voltage level of the control signal is changed in accordance with this voltage change. Thus, the load current can be limited within a predetermined.

When the output transistor and the current-detecting transistor are constituted by MOS transistors as described above, the output transistor and the current-detecting transistor are connected in such a manner that their drains serve as the first output terminals, their sources serve as the second output terminals, and their gates serve as the control terminals. The second transistor has two output terminals connected in series between the signal line and the output terminal of the operational amplifier.

More specifically, the drain of the output transistor is connected to the drain of the current-detecting transistor. The gate of the output transistor is connected to the gate of the current-detecting transistor. The source of the output transistor is connected to the non-inversion input terminal of the operational amplifier, while the source of the current-detecting transistor is connected to the inversion input terminal of the operational amplifier. Two output terminals of the first transistor are connected in series between the source of the current-detecting transistor and the output terminal of the operational amplifier. The second transistor is associated with the first transistor to constitute the current-mirror circuit. Two output terminals of this second transistor are connected in series between the signal line and the output terminal of the operational amplifier.

In this current-limiting circuit, the output transistor and the current-detecting transistor may be constituted by N-channel type MOS transistors and the output transistor may be connected to the higher-voltage side of the electrical load. Alternatively, the output transistor and the current-detecting transistor may be constituted by P-channel type MOS transistors and the output transistor may be connected to the lower-voltage side of the electrical load. In any case, the output voltage of the operational amplifier needs not vary beyond the potential range between the first voltage terminal and the second voltage terminal. Therefore, no special power source voltage is required for the operational amplifier.

On the contrary, in the above current-limiting circuit, the output transistor and the current-detecting transistor may be constituted by N-channel type MOS transistors but the output transistor may be connected to the lower-voltage side of the electrical load. In this case, however, the source of the output transistor is connected to the second voltage terminal. This forces the operational amplifier to produce an output voltage lower the electrical potential of the second voltage terminal. In other words, there is a necessity of providing a special power source voltage lower than the second voltage terminal for the operational amplifier. Similarly, in the above current-limiting circuit, the output transistor and the current-detecting transistor may be constituted by P-channel type MOS transistors but the output transistor may be connected to the higher-voltage side of the electrical load. In this case, however, the source of the output transistor is connected to the first voltage terminal. This forces the operational amplifier to produce an output voltage higher than the electrical potential of the first voltage terminal. In other words, there is a necessity of providing a special power source voltage higher than the first voltage terminal for the operational amplifier.

Preferable arrangements of the present invention require no preparation of any special power source voltage for the operational amplifier in the low-side connecting arrangement using N-channel type MOS transistors. Another preferable arrangements of the present invention require no preparation of any special power source voltage for the operational amplifier in the high-side connecting arrangement using P-channel type MOS transistors.

More specifically, the output transistor and the current-detecting transistor may be constituted by N-channel type MOS transistors. In this case, the output transistor and the current-detecting transistor are connected in such a manner that their sources serve as the first output terminals, their drains serve as the second output terminals, and their gates serve as the control terminals. The drain of the output transistor is connected to the electrical load at an end opposed to the first voltage terminal, while the source of the output transistor is connected to the second voltage terminal. The source of the output transistor is connected to the source of the current-detecting transistor, while the gate of the output transistor is connected to the gate of the current-detecting transistor. The drain of the output transistor is connected to the non-inversion input terminal of the operational amplifier, while the drain of the current-detecting transistor is connected to the inversion input terminal of the operational amplifier. Furthermore, the so-called low-side connecting arrangement is adopted so that the output transistor is connected to the lower-voltage side of the electrical load.

Furthermore, the first and second transistors may be constituted by PNP type bipolar transistors or P-channel type MOS transistors, and one output terminal of the second transistor may be connected to the output terminal of the operational amplifier. A current path is formed between the other output terminal of the second transistor and the second voltage terminal. And, current pull-in means is provided for pulling in current from the signal line to the second voltage terminal by an amount corresponding to the current flowing across the second transistor.

According to the above current-limiting circuit, current flows from the end of the electrical load opposed to the first voltage terminal to the second voltage terminal via the output transistor (from drain-to source). Thus, the load current flows across the electrical load. The operational amplifier varies its output to set the same electrical potential for the drains of the output transistor and the current-detecting transistor. The current flows in response to the load current from the output terminal of the operational amplifier to the second voltage terminal via the first transistor and the current-detecting transistor.

Then, the current having the magnitude of a predetermined multiple to the current flowing across the first transistor flows through the electrical path extending from the output terminal of the operational amplifier to the second voltage terminal via the second transistor and the current pull-in means. The current pull-in means pulls in the current from the signal line to the second voltage terminal by an amount corresponding to this current.

In short according to the above current-limiting circuit, in the low-side connecting arrangement using N-channel type MOS transistors, the source of the output transistor is connected to the source of the current-detecting transistor, while the gate of the output transistor is connected to the gate of the current-detecting transistor. The drains of both transistors are connected to the non-inversion input terminal and the inversion input terminal of the operational amplifier. Furthermore, the current pull-in means is provided to reverse the direction of the current flowing across the second transistor and pull in the current from the signal line.

The above-described current-limiting circuit requires no preparation of any special power source voltage for the operational amplifier because the output voltage of the operational amplifier needs not vary beyond the potential range between the first and second voltage terminals, in the same manner as in the above-described current-limiting circuit adopting the low-side connecting arrangement using P-channel type MOS transistors.

In this case, the current pull-in means may comprise a third transistor and a fourth transistor. The third transistor is constituted by an NPN type bipolar transistor or an N-channel type MOS transistor. Two output terminals of this third transistor are connected in series between the other output terminal (i.e., output terminal opposed to the operational amplifier) of the second transistor and the sources (i.e., second voltage terminals) of the output transistor and the current-detecting transistor. The fourth transistor is identical in type and polarity with the third transistor and associated with this third transistor to constitute a secondary current-mirror circuit. Two output terminals of the fourth transistor are connected in series between the signal line and the sources of the output transistor and the current-detecting transistor, so that current flowing from the signal line to the second voltage terminal becomes a predetermined multiple to the current flowing across the third transistor via the second transistor.

In short, the current pull-in means is constituted by the secondary current-mirror circuit consisting of the third and fourth transistors. The third transistor forms part of the above-described current path. The fourth transistor pulls in the current from the signal line to the second voltage terminal by an amount corresponding to the current flowing across the second transistor.

Constituting the current pull-in means by the secondary current-mirror circuit consisting of the third and forth transistors is advantageous in that the current-limiting circuit operates effectively without deteriorating the accuracy in the current limiting operation for the load current.

On the other hand, the output transistor and the current-detecting transistor may be constituted by P-channel type MOS transistors. In this case, the output transistor and the current-detecting transistor are connected in such a manner that their sources serve as the first output terminals, their drains serve as the second output terminals, and their gates serve as the control terminals. The source of the output transistor is connected to the first voltage terminal. The drain of the output transistor is connected to the electrical load at an end opposed to the second voltage terminal. More specifically, the source of the output transistor is connected to the source of the current-detecting transistor, while the gate of the output transistor is connected to the gate of the current-detecting transistor. The drain of the output transistor is connected to the non-inversion input terminal of the operational amplifier, while the drain of the current-detecting transistor is connected to the inversion input terminal of the operational amplifier. Furthermore, the so-called high-side connecting arrangement is adopted so that the output transistor is connected to the higher-voltage side of the electrical load.

Furthermore, the first and second transistors may be constituted by NPN type bipolar transistors or N-channel type MOS transistors, and one output terminal of the second transistor may be connected to the output terminal of the operational amplifier. A current path is formed between the other output terminal of the second transistor and the first voltage terminal. And, current send-out means is provided for sending out current from the first voltage terminal to the signal line by an amount corresponding to the current flowing across the second transistor.

According to this current-limiting circuit, the load current flows from the first voltage terminal to the electrical load via the output transistor (from source to drain). The operational amplifier varies its output to set the same electrical potential for the drains of the output transistor and the current-detecting transistor. The current flows in response to the load current from the first voltage terminal to the output terminal of the operational amplifier via the current-detecting transistor and the first transistor.

Then, the current having the magnitude of a predetermined multiple to the current flowing across the first transistor flows from the first voltage terminal to the output terminal of the operational amplifier via the electrical path formed by the current pull-in means and the second transistor. The current send-out means sends out the current the current from the first voltage terminal to the signal line by an amount corresponding to this current.

In short, according to the above current-limiting circuit, in the high-side connecting arrangement using P-channel type MOS transistors, the source of the output transistor is connected to the source of the current-detecting transistor, while the gate of the output transistor is connected to the gate of the current-detecting transistor. The drains of both transistors are connected to the non-inversion input terminal and the inversion input terminal of the operational amplifier. Furthermore, the current send-out means is provided to reverse the direction of the current flowing across the second transistor and send out the current to the signal line.

The above-described current-limiting circuit requires no preparation of any special power source voltage for the operational amplifier because the output voltage of the operational amplifier needs not vary beyond the potential range between the first and second voltage terminals, in the same manner as in the current-limiting circuit adopting the high-side connecting arrangement using N-channel type MOS transistors.

In this case, the current send-out means may comprise a third transistor and a fourth transistor. The third transistor is constituted by a PNP type bipolar transistor or a P-channel type MOS transistor. Two output terminals of this third transistor are connected in series between the other output terminal (i.e., output terminal opposed to the operational amplifier) of the second transistor and the sources (i.e., first voltage terminals) of the output transistor and the current-detecting transistor. The fourth transistor is identical in type and polarity with the third transistor and associated with this third transistor to constitute a secondary current-mirror circuit. Two output terminals of the fourth transistor are connected in series between the signal line and the sources of the output transistor and the current-detecting transistor, so that current flowing from the first voltage terminal to the signal line becomes a predetermined multiple to the current flowing across the third transistor via the second transistor.

In short, according to the above current-limiting circuit, the current send-out means is constituted by the secondary current-mirror circuit consisting of the third and fourth transistors. The third transistor forms part of the above-described current path. The fourth transistor pulls in the current from the first voltage terminal to the signal line by an amount corresponding to the current flowing across the second transistor.

Constituting the current send-out means by the secondary current mirror circuit consisting of the third and forth transistors is advantageous in that the current-limiting circuit operates effectively without deteriorating the accuracy in the current limiting operation for the load current.

Preferably, the potential-difference producing means is added to the current-limiting circuit of the present invention. More specifically, the potential-difference producing means produces an electrical potential difference equivalent to the base-emitter voltage or the gate-source voltage of the third transistor. The potential-difference producing means is interposed between the base or gate of the first and second transistors mutually connected to constitute the current-mirror circuit and the drain of the current-detecting transistor. This arrangement makes it possible to perform the current-limiting operation even when the electrical potential difference between two output terminals (drain-source terminals) of the output transistor is substantially 0V.

The reasons will be explained hereinafter, referring the case where the first through fourth transistors are constituted by bipolar transistors.

In general, two bipolar transistors can constitute a current-mirror circuit. In this case, the bases of these bipolar transistors are connected each other, and the emitters of these bipolar transistors are connected each other. Referential current flows across a specific transistor (i.e., first or third transistor in the present invention, referred to as referential transistor hereinafter). In this reference transistor, the collector is connected to the base. The current-mirror circuit is activated when an electrical potential of about 0.6 V equivalent to the base-emitter voltage is applied between the output terminals, collector and emitter, of the referential transistors.

For example, in the above current-limiting circuit, the first transistor (more specifically, its collector and emitter) may be connected in series between the output terminal of the operational amplifier and the drain (i.e., second output terminal) of the current-detecting transistor. The electrical potential of about 0.6 V equivalent to the base-emitter voltage of the first transistor is applied between the output terminal of the operational amplifier and the drain of the current-detecting transistor. When the electrical potential difference between two output terminals of the output transistor is 0V, the electrical potential difference between two output terminals of the current-detecting transistor becomes 0V, according to the present invention. Thus, the electrical potential difference between the output terminal of the operational amplifier and the source (i.e., first output terminal) of the current-detecting transistor becomes 0.6V.

However, according to the preferable current-limiting circuit of the present, the second transistor and the third transistor are connected in series between the output terminal of the operational amplifier and the source of the current-detecting transistor. The second transistor is associated with the first transistor to constitute the current-mirror circuit. The third transistor serves as a referential transistor of the secondary current-mirror circuit. When the electrical potential difference between the output terminal of the operational amplifier and the source of the current-detecting transistor is about 0.6V, the second transistor and the third transistor cannot be operated. Thus, the current-limiting operation cannot be performed.

This is why the potential-difference producing means is provided in the preferable arrangement of the present invention. According to this arrangement, an electrical potential difference of about 1.2V is generated between the output terminal of the operational amplifier and the source of the current-detecting transistor even when two output terminals of the output transistor is 0V. The electrical potential difference of about 1.2V is equivalent to a sum of the base-emitter voltage of the first transistor and the electrical potential difference produced by the potential-difference producing means (i.e., electrical potential difference equivalent to the base-emitter voltage of the third transistor). Accordingly, it becomes possible to assure the operation of the second transistor and the third transistor. The current-limit operation can be performed surely.

When the current-mirror circuit is constituted by two MOS transistors, it is general that the gates of these transistors are connected each other and the sources of these transistors are connected each other. The drain and the gate of the referential transistor are connected each other. When the first through fourth transistors are constituted by MOS transistors, the potential-difference producing means needs to produce an electrical potential difference equivalent to the gate-source voltage of the third transistor between the gates of the first and second transistors and the drain of the current-detecting transistor. According to this arrangement, the electrical potential difference between the output terminal of the operational amplifier and the source of the current-detecting transistor is increased by an amount equivalent to the gate-source voltage of the third transistor. This is effective to perform the current-limit operation accurately even when the electrical potential difference between two output terminals of the output transistor is substantially 0V.

Moreover, MOS transistors constituting both of the output transistor and the current-detecting transistor can be replaced by bipolar transistors having collectors, emitters and bases equivalent to the drains, sources and gates of the MOS transistors.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to accompanied embodiments.

First embodiment

Figure 1:
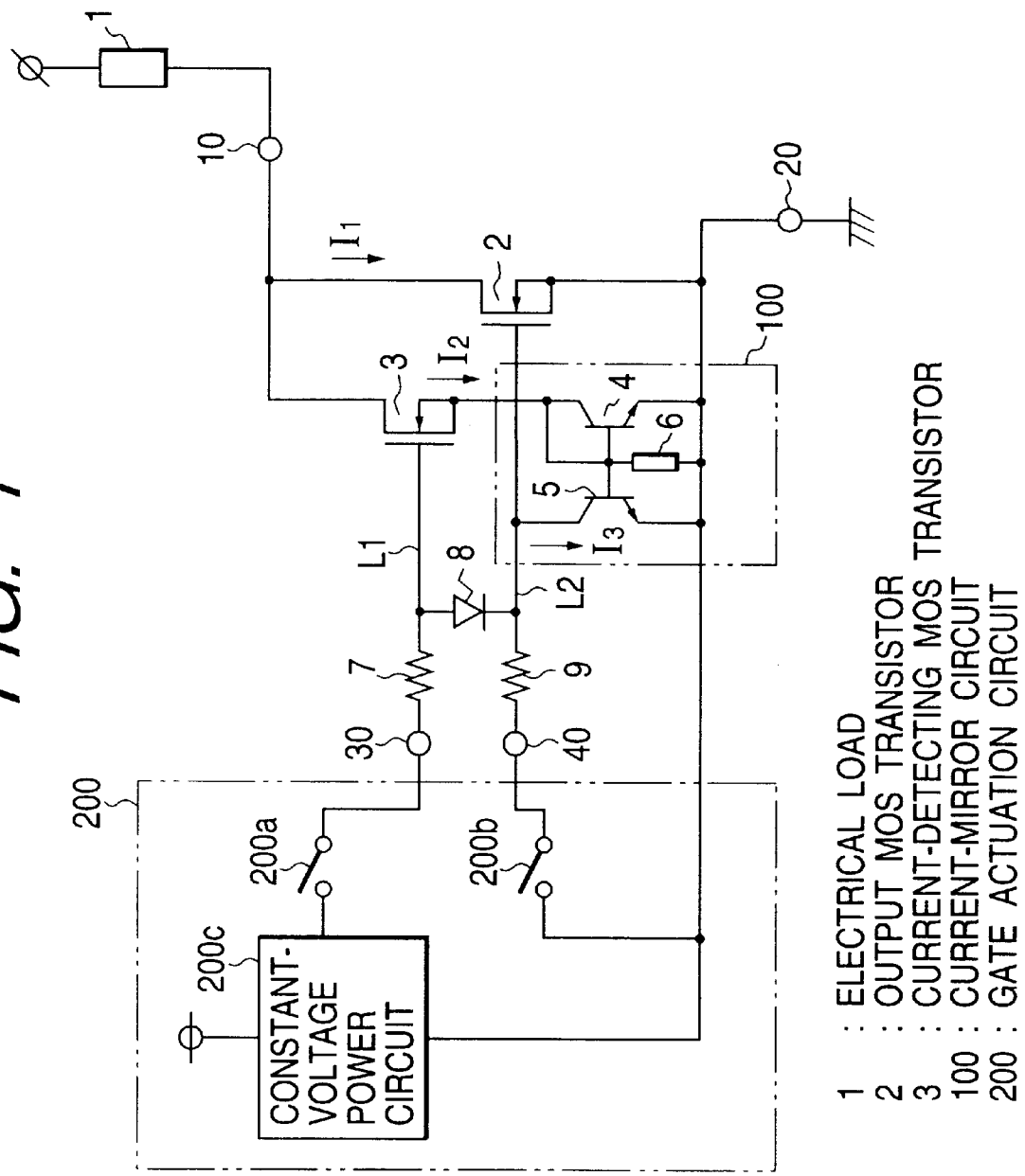
FIG. 1 is a circuit diagram showing a load actuation circuit is accordance with a first embodiment of the present invention.

FIG. 1 shows a load actuation circuit in accordance with a first embodiment of the present invention. This load actuation circuit comprises an output MOS transistor 2 feeding the load current to an electrical load 1 and a current-detecting MOS transistor 3 connected in parallel with the output MOS transistor 2. A drain and a gate of current-detecting MOS transistor 3 are connected to a drain and a gate of output MOS transistor 2, respectively.

A first signal line L1 is connected to the gate of current-detecting MOS transistor 3. A gate voltage, serving as a control signal, is fed via a resistor 7 in the first signal line L1 to the gate of current-detecting MOS transistor 3. An intermediate point between resistor 7 and current-detecting MOS transistor 3 is connected to the gate of output MOS transistor 2 by a second signal line L2. The gate voltage is fed via a diode 8 to the gate of output MOS transistor 2.

The source of current-detecting MOS transistor 3 is connected to an NPN transistor 4 of a current-mirror circuit 100. Another NPN transistor 5, constituting the other part of current-mirror circuit 100, is associated with the NPN transistor 4. The NPN transistors 4 and 5 are connected commonly at their bases and emitters. The collector of NPN transistor 5 is connected to the second signal line L2. The collector current flows from the second signal line L2 into the NPN transistor 5.

The common base of NPN transistors 4 and 5 is connected to an element 6 such as a constant-current circuit, a resistor, an inductor or the like. This element 6 has a function of leaking noises to the ground and stabilizing the operation of the circuit.

The second signal line L2 is connected to another signal line having a resistor 9. This signal line with resistor 9 has a function of discharging the electric charge stored in the gate of the output MOS transistor 2. Reference numeral 10 denotes an output terminal, through which the load actuation circuit is connected to the electrical load 1. Reference numeral 20 denotes an earth terminal, through which the load actuation circuit is grounded. Reference numerals 30 and 40 denote input terminals, through which the load actuation circuit is connected to a gate actuation circuit 200. The gate actuation circuit 200 actuates the gate of the output MOS transistor 2 as well as the gate of the current-detecting MOS transistor 3.

The gate actuation circuit 200 comprises two switching elements 200a, 200b and a constant-voltage power circuit 200c.

An operation of the above-described arrangement will be explained, hereinafter.

To deactivate the electrical load 1, one switching element 200a is opened and the other switching element 200b is closed. The gate-source voltage of output MOS transistor 2 becomes 0V in this case. The output MOS transistor 2 is maintained in a deactivated condition. Thus, no load current is fed to the electrical load 1.

To activate the electrical load 1, the switching element 200a is closed and the other switching element 200b is opened. The constant-voltage power circuit 200c is connected to the resistor 7 via the closed switching element 200a. A high-level gate voltage is supplied to the gate of the current-detecting MOS transistor 3. The current-detecting MOS transistor 3 is turned into an activated condition. Meanwhile, the high-level gate voltage is supplied via the diode 8 to the gate of output MOS transistor 2. Thus, the output MOS transistor 2 is turned on and the load current is supplied to the electrical load 1.

During the activated condition of the electrical load 1, there is a possibility that the electrical load 1 has a low impedance due to short-circuit or any other reason. The load current in such an unusual or extraordinary condition becomes large compared with the load current in an ordinary operating condition. Thus, the electric potential of the output terminal 10 increases. If the electric potential of the output terminal 10 exceeds a base-emitter forward voltage, i.e., a voltage required for feeding the base current to the NPN transistor 4, part of the load current flows into the current-detecting MOS transistor 3.

This current is attenuated into 1/n through the current-mirror circuit 100 consisting of NPN transistor 4 and 5. The NPN transistor 5 has a function of pulling in current from the signal line L2. Thus, the current flows from the signal line L2 to the NPN transistor 5. A voltage drop is caused at the resistor 7. The gate voltages of output MOS transistor 2 and current-detecting MOS transistor 3 are reduced. This results in a reduction of the drain current (i.e., load current) of output MOS transistor 2.

Accordingly, when the load current exceeds a predetermined value, the load current is reduced by the above-described function of the load actuation circuit. Thus, the load current is limited within a predetermined value.

During an operation of the current-mirror circuit 100, the source potential of current-detecting MOS transistor 3 is increased by an amount equivalent to the base-emitter voltage of the NPN transistor 4. Meanwhile, the gate potential of output MOS transistor 2 is increased by an amount equivalent to its forward voltage due to the presence of diode 8 in the signal line L2.

Accordingly, by setting the same gate-source voltage for both of the output MOS transistor 2 and the current-detecting MOS transistor 3, the operating point can be equalized or synchronized for the MOS transistors 2 and 3. A ratio of the drain current of output MOS transistor 2 to the drain current of current-detecting MOS transistor 3 becomes constant. Thus, a stable current-detecting operation can be realized.

Diode 8 has a function of generating a voltage equivalent to the base-emitter voltage of the NPN transistor 4. This diode 8 can be replaced by an appropriate other electrical component capable of generating a forward voltage by using a PN junction, such as a transistor having a base and an emitter common each other or a transistor having a base and a collector common each other. Alternatively, any other component can be used if it can cause a voltage drop substantially identical with the base-emitter voltage of NPN transistor 4.

In this first embodiment, it is supposed that the output MOS transistor 2 and the current-detecting MOS transistor 3 have ideal characteristics. Thus, the base-emitter forward voltage of NPN transistor 4 is equal to the forward voltage of diode 8. When a voltage V1 is applied to the input terminal 30, the electrical potential of output terminal 10 may become sufficiently larger than the base-emitter forward voltage Vf of NPN transistor 4. In this case, the gate-source voltage $V_{GS}$ is expressed by the following equation.

$$V_{GS} = V1 - (I1/m \cdot n) \cdot R7 - Vf \quad (1)$$

where "m" represents a ratio of current I1 flowing across output MOS transistor 2 to current I2 flowing across NPN transistor 4, "n" represents a ratio of current I2 flowing across NPN transistor 4 to current I3 flowing across NPN transistor 5, and R7 represents a resistance value of resistor 7.

In general, drain current (i.e. current I1) in a saturated region of a MOS transistor has a relationship with respect to the gate-source voltage $V_{GS}$, a expressed by the following equation.

$$I1 = (\tfrac{1}{2}) \cdot \beta_0 \cdot (W/L) \cdot (V_{GS} - V_T)^2 \quad (2)$$

where "$\beta_0$" represents a constant, "W" represents a channel width, "L" represents a channel length, "$V_T$" represents a threshold voltage.

From the above-described equations (1) and (2), the current I1 flowing across the output MOS transistor 2 is expressed by the following equation.

$$I1 = (m \cdot n/R7) \cdot [V1 - \{I1 \cdot (L/W) \cdot 2/\beta_0\}^{1/2} - V_T - Vf] \quad (3)$$

When the output MOS transistor 2 has a sufficient durability against the load current, the following approximation is established.

$$\{I1 \cdot (L/W) - (2/\beta_0)\}^{1/2} \approx 0 \quad (4)$$

Accordingly, the above-described equation (3) is rewritten into the following equation.

$$I1 \approx (m \cdot n/R7) \cdot (V1 - V_T - V_f) \quad (5)$$

Accordingly, the load current varies depending on the current ratio "m" of output MOS transistor 2 to current-detecting MOS transistor 3, the current-mirror ratio "n" between NPN transistors 4 and 5, the voltage V1 applied to the input terminal 30, and the forward voltage Vf of diode 8. In other words, the load current does not vary depending on the voltage of the output terminal 10.

In fabricating a semiconductor integrated circuit, it is relatively easy to control the values of "m", "n" and "Vf" accurately. This is advantageous in obtaining a stable load current without fluctuation due to characteristics dispersion in each element.

Furthermore, trimming the resistor 7 is effective in improving the accuracy for the resistance value. This leads to a realization of stable characteristics.

Figure 2:
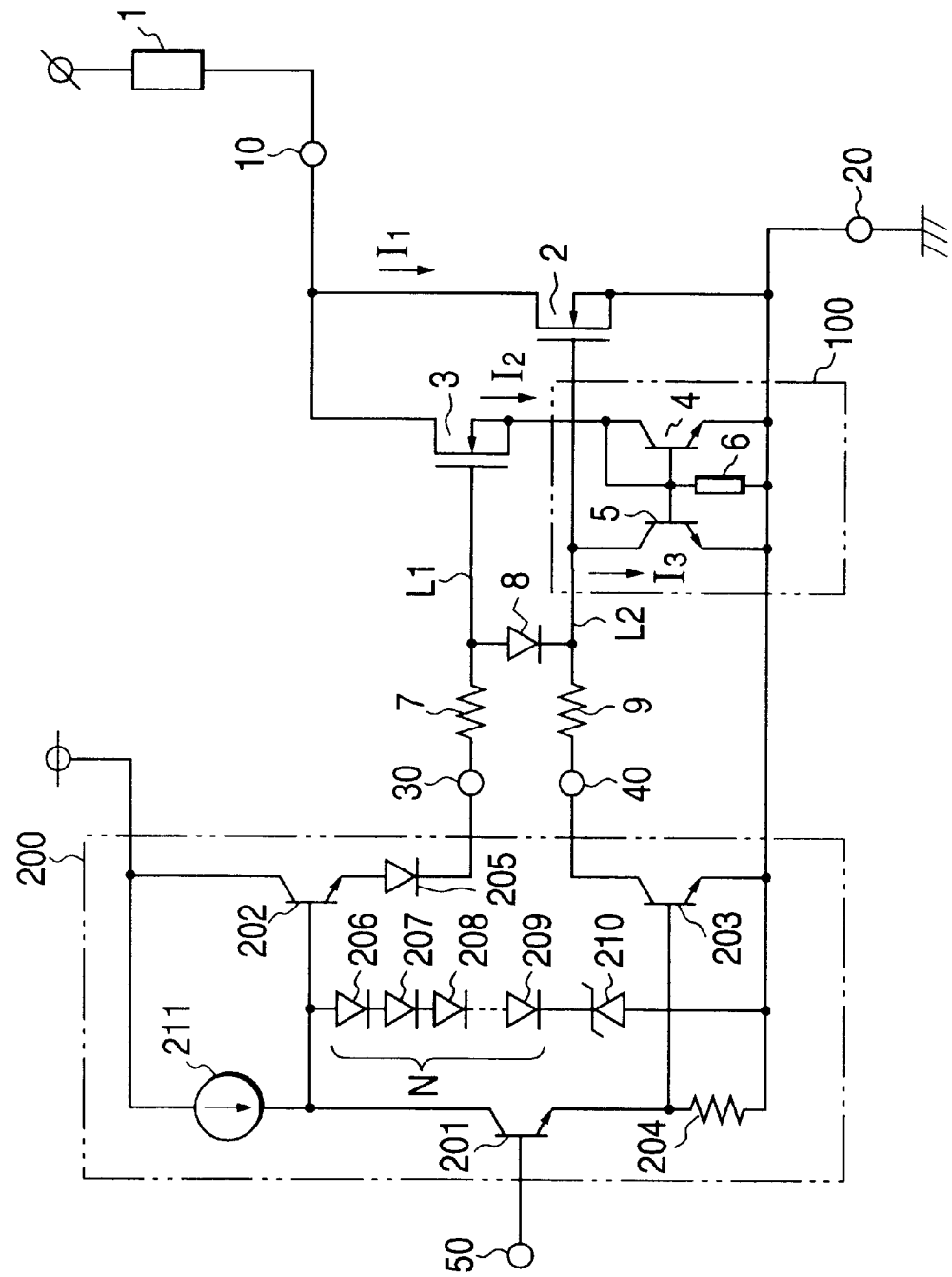
FIG. 2 is a circuit diagram showing a detailed arrangement of a gate actuation circuit shown in FIG. 1.

FIG. 2 shows a detailed arrangement of the gate actuation circuit 200. The gate actuation circuit 200 comprises NPN transistors 201 to 203, a resistor 204, diodes 205 to 209, a Zener diode 210, and a constant-current circuit 211.

When a high-level voltage is applied to the terminal 50, NPN transistor 201 is turned on. NPN transistor 202 is turned off. And, NPN transistor 203 is turned on. This condition is equivalent to the closure of switching element 200b and the opening of switching element 200a shown in FIG. 1. In this condition, the output MOS transistor 2 is turned off. Therefore, no load current flows across the electrical load 1.

When a low-level voltage is applied to the terminal 50, NPN transistor 201 is turned off. NPN transistor 202 is turned on. And, NPN transistor 203 is turned off. This condition is equivalent to the opening of switching element 200b and the closure of switching element 200a shown in FIG. 1. In this condition, the output MOS transistor 2 is turned on. Therefore, the load current is supplied to the electrical load 1.

Using the voltage produced by a total of N diodes 206–209 and the Zener diode 210, the base-emitter voltage of NPN transistor 202, and the forward voltage by the diode 205, the voltage V1 of input terminal 30 is expressed by the following equation.

$$V1 = V_z + N \cdot Vf - 2 \ Vf = Vz + (N-2) \cdot Vf \quad (6)$$

From the above-described equations (5) and (6), the current I1 flowing across the output MOS transistor 2 can be expressed by the following equation.

$$I1 \approx (m \cdot n/R7)\{Vz + (N-3) \cdot Vf - V_T\} \quad (7)$$

where Vz has a positive temperature coefficient, while Vf has a negative temperature coefficient. Accordingly, the term $\{Vz+(N-3) \cdot Vf\}$ in the above equation (7) as a whole has a possibility of possessing either a positive temperature coefficient or a negative temperature coefficient depending on the value of "N". In other words, setting an optimum value for the N value by considering the temperature characteristics of R7, $V_T$ and others makes it possible to completely cancel the undesirable temperature characteristics of the load actuation circuit.

The combination of N diodes 206–209 and Zener diode 210, serving as a means for generating the base voltage for the NPN transistor 202, can be replaced by a plurality of serially connected diodes, or a plurality of serially connected Zener diodes, or a plurality of N-channel or P-channel MOS serially connected transistor, or by a plurality of resistors.

Second embodiment

The above-described first embodiment is characterized in that the current-limit operation is performed when the electrical potential of output terminal 10 exceeds a value equivalent to the base-emitter voltage Vf of NPN transistor 4. However, it may be desirable to increase the voltage for initiating the current-limit operation to a value higher than the one stage of the base-emitter voltage Vf in accordance with the value of electrical load 1.

Figure 3:
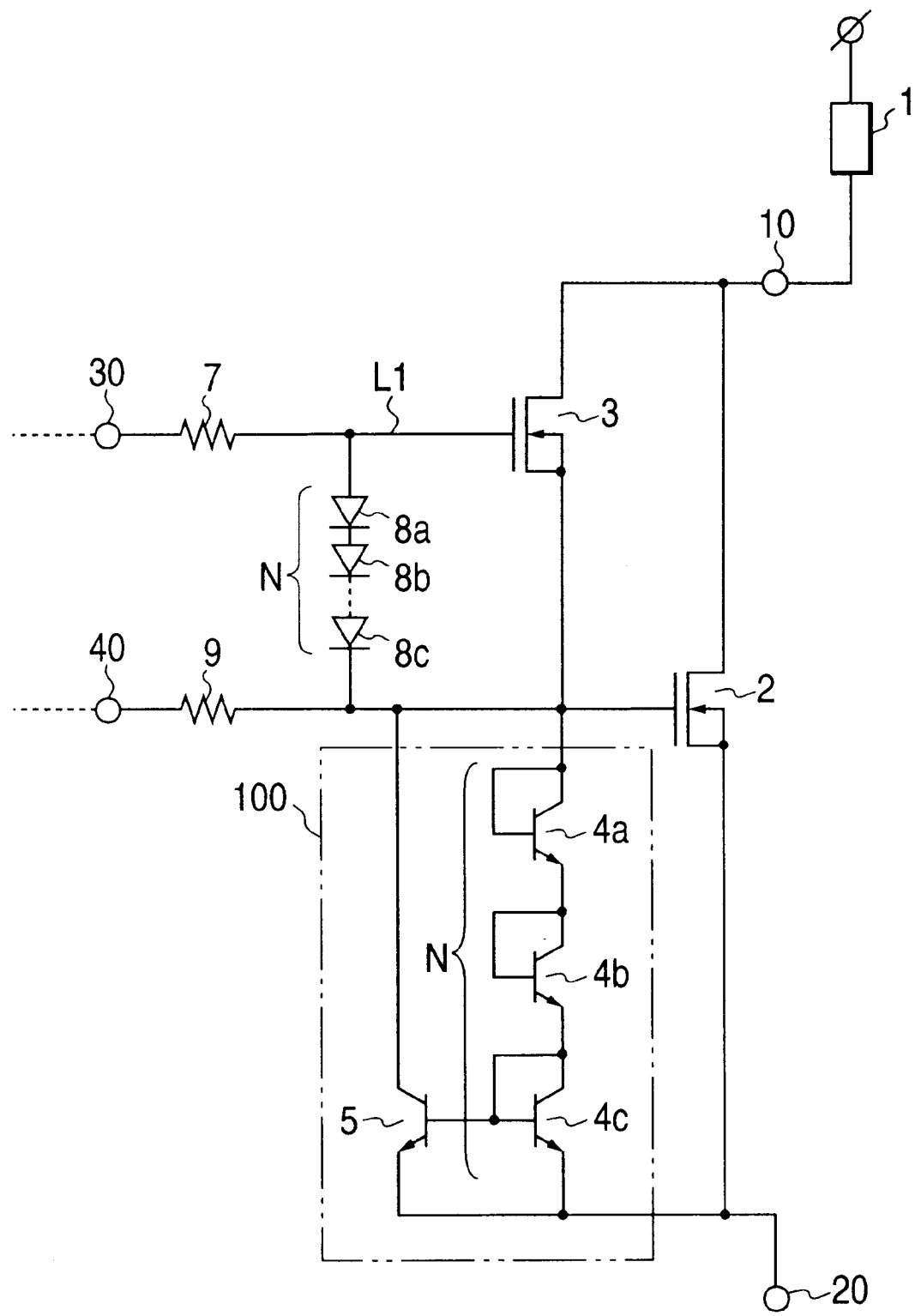
FIG. 3 is a circuit diagram showing a load actuation circuit is accordance with a second embodiment of the present invention.

To satisfy such a requirement, the second embodiment replaces the NPN transistor 4 connected to the source of current-detecting MOS transistor 3 by a total of N, serially connected, NPN transistors 4a, 4b, - - - , 4c each having a base and a collector connected commonly, as shown in FIG. 3. According to the arrangement of the second embodiment, the current-limit operation is not performed unless the voltage of output terminal 10 exceeds a value equivalent to N times the base-emitter voltage Vf. Thus, the voltage for initiating the current-limit operation can be increased to a value equivalent to N stages of the base-emitter voltage Vf.

In this second embodiment, a total of N, serially connected, diodes 8a, 8b, - - - , 8c are provided instead of using the diode 8 shown in FIG. 1. This arrangement is necessary to equalize the gate-source voltage of the current-detecting MOS transistor 3 with the gate-source voltage of output MOS transistor 2. The total of N NPN transistors 4a, 4b, - - - , 4c, as a whole, has a function of a first bipolar transistor of the present invention.

Third embodiment

The above-described embodiments are characterized in that the electrical load 1 is actuated by the output MOS transistor 2 of N-channel type disposed at the lower-voltage side of the electrical load 1. It is alternatively possible to use an output MOS transistor 2 of P-channel type disposed at the higher-voltage side of the electrical load 1, to actuate the electrical load 1.

Figure 4:
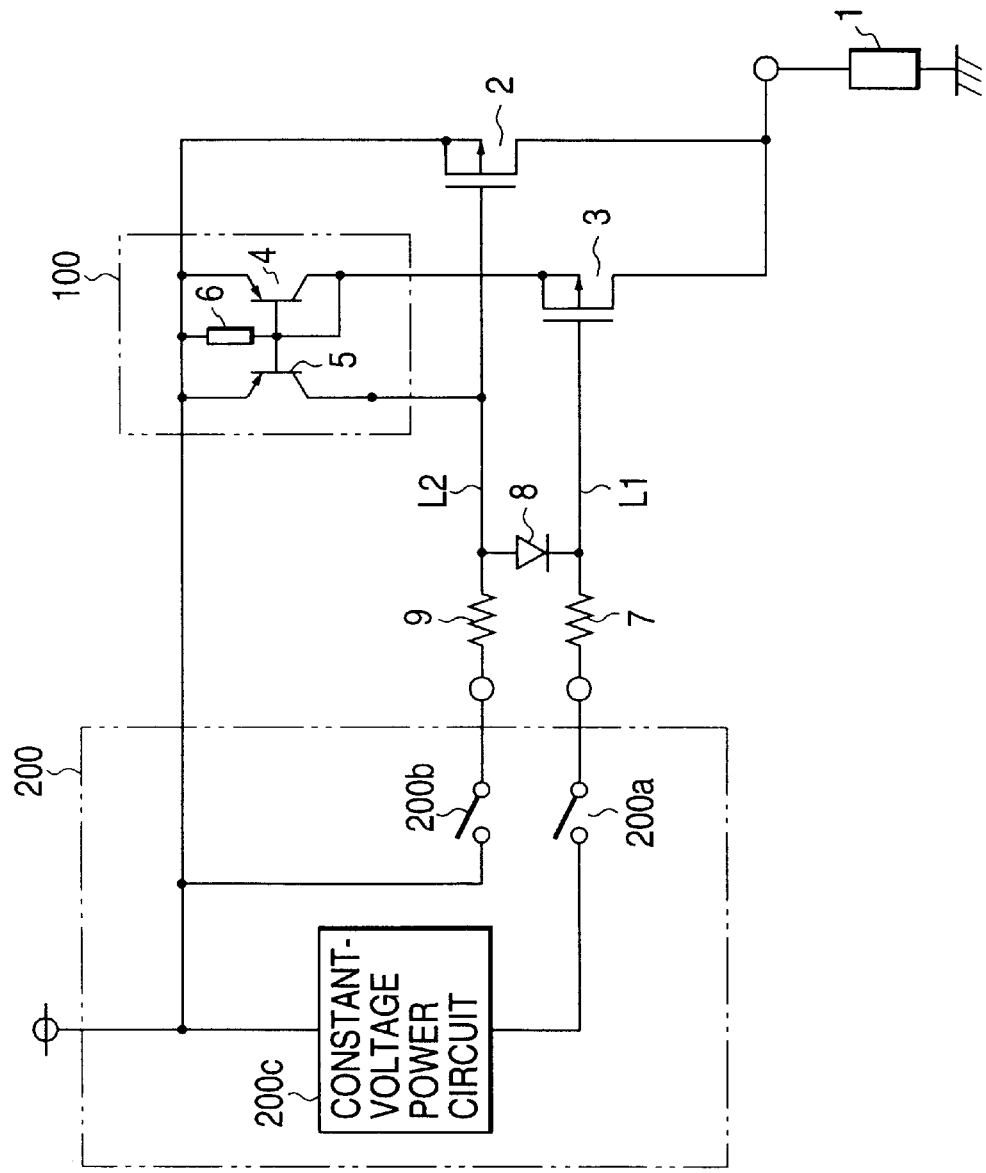
FIG. 4 is a circuit diagram showing a load actuation circuit is accordance with a third embodiment of the present invention.

The third embodiment, as shown in FIG. 4, discloses an arrangement for realizing such a load actuation circuit having a high-side connecting arrangement. More specifically, this load actuation circuit comprises a P-channel type output MOS transistor 2 and a P-channel type current-detecting MOS transistor 3. Bipolar transistors 4 and 5, used in the current-mirror circuit, are PNP transistors. These components are disposed at the higher-voltage side of the electrical load 1.

An operation of this embodiment is substantially the same as that of the first embodiment. In the current-limiting operation, the current flowing across PNP transistor 5 is guided via diode 8 to the resistor 7. Due to this current, the terminal voltage of the resistor 7 is increased and therefore the gate voltage of the output MOS transistor 2 is increased. Thus, the drain current of the output MOS transistor 2 is reduced.

Fourth embodiment

The above-described various embodiments are characterized in that the current-mirror circuit 100 is constituted by bipolar transistors. It is however possible to constitute the current-mirror circuit 100 by MOS transistors.

Figure 5:
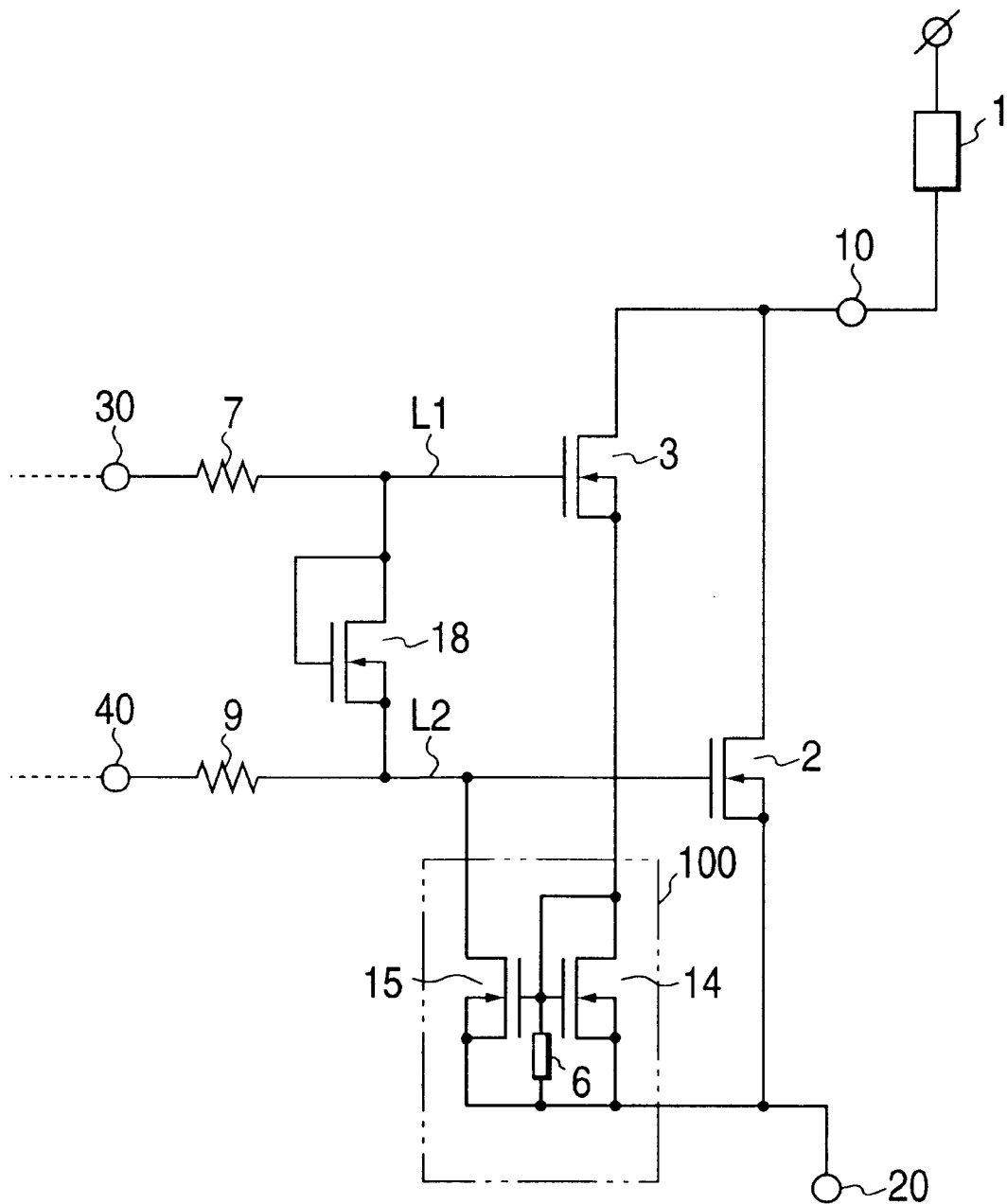
FIG. 5 is a circuit diagram showing a load actuation circuit is accordance with a fourth embodiment of the present invention.

The fourth embodiment, as shown in FIG. 5, discloses such an arrangement. The current-mirror circuit 100 is constituted by first and second MOS transistors 14 and 15. A voltage drop means for setting the same operating point for the MOS transistors 2 and 3 is constituted by a MOS transistor 18 having a gate and a drain connected directly.

An operation of the fourth embodiment is substantially the same as that of the first embodiment. According to the arrangement of the fourth embodiment, the current-limiting operation is performed when the voltage of output terminal 10 exceeds the threshold voltage of the first MOS transistor 14.

As described in the second embodiment, it is possible to increase the voltage for initiating the current-limiting operation by increasing the number of first MOS transistor 14. Furthermore, as described in the third embodiment, it is possible to disposes the load actuation circuit to the higher-voltage side of the electrical load 1.

Fifth embodiment

The above-described various embodiments are characterized in that the current flowing across the output MOS transistor 2 is limited within a constant value when the load current exceeds a predetermined value. According to this current-limiting arrangement, the output MOS transistor 2 is always subjected to a significant amount of current. This possibly increases the loss in the output MOS transistor 2.

Figure 6:
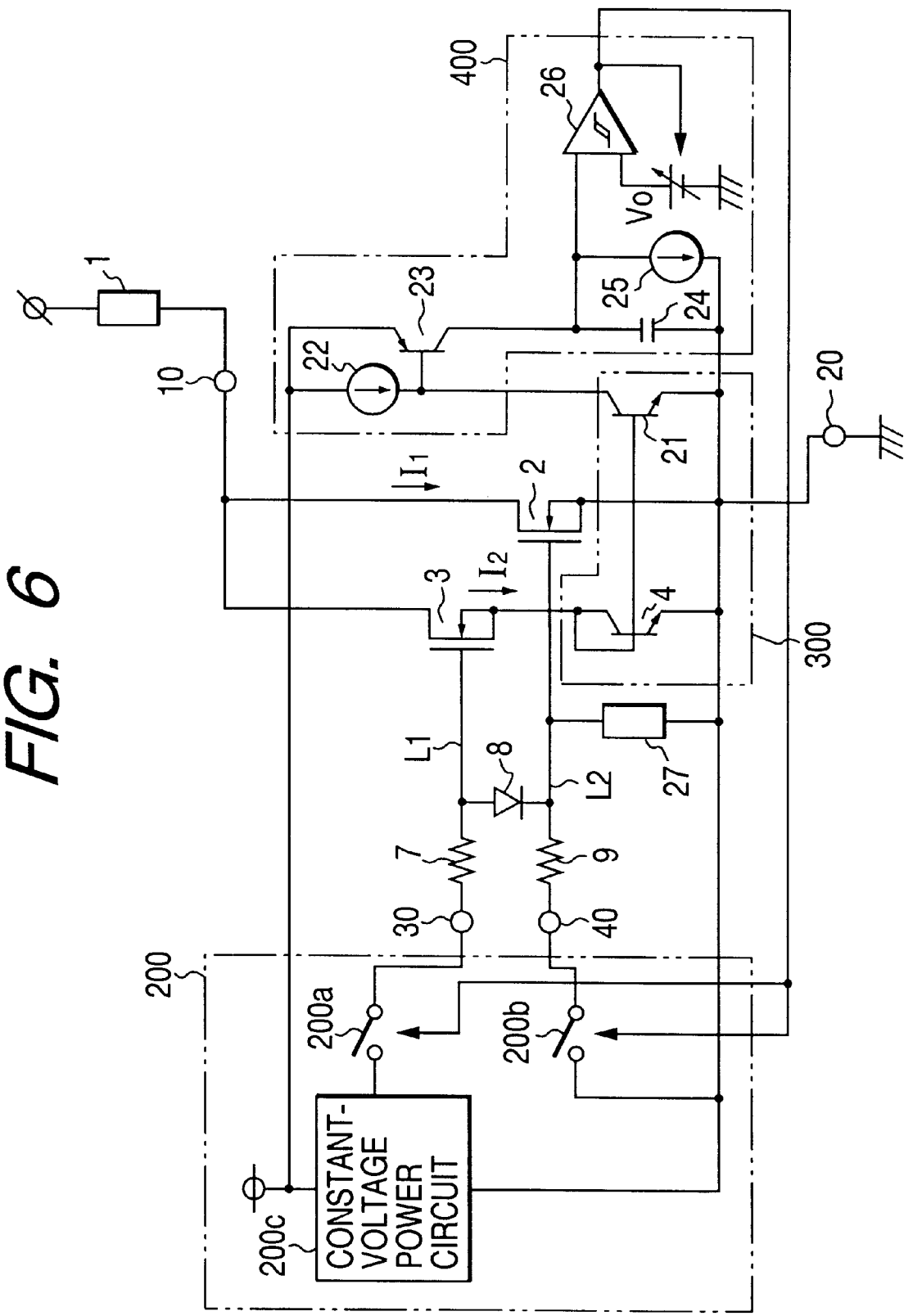
FIG. 6 is a circuit diagram showing a load actuation circuit is accordance with a fifth embodiment of the present invention.

To reduce this kind of loss, the fifth embodiment intermittently controls the drain current of the output MOS transistor 2 to realize an effective protection against excessive current and reduce the loss in the output MOS transistor 2. FIG. 6 shows a detailed arrangement of the load actuation circuit in accordance with the fifth embodiment.

The current-detecting MOS transistor 3 has a source connected to an NPN transistor 4. This NPN transistor 4 is associated with another NPN transistor 21 to constitute a current-mirror circuit 300. The base and the emitter of NPN transistor 4 are connected to the base and the emitter of NPN transistor 21, respectively. The NPN transistor 21 is connected to a constant-current source 22.

According to the arrangement of this embodiment, the current flowing across the NPN transistor 21 is expressed by I1/m·n', where m represents a ratio of the drain current I1 of the output MOS transistor 2 to the current flowing across the first NPN transistor 4, n' represents a ratio of the current flowing across the first NPN transistor 4 and the current flowing across the NPN transistor 21.

When the drain current flowing across the output MOS transistor 2 is in a normal range, the current flowing across the NPN transistor 21 may be equal to or smaller than the setting current I11 of the constant-current source 22. In such a case, i.e., when I1/m·n'≦I11, the PNP transistor 23 is turned off.

However, when the drain current of the output MOS transistor 2 increases excessively, the current flowing across the NPN transistor 21 possibly becomes larger than the setting current I11 of the constant-current source 22. That is, when I1/m·n'>I11, the PNP transistor 23 is turned on due to a forward bias applied between their base and emitter.

As a result, a capacitor 24 is charged by the collector current of the PNP transistor 23. When the terminal voltage of capacitor 24 exceeds a reference voltage Vo of a hysteresis comparator 26, the comparator 26 produces a high-level output. In response to this high-level output, the switching element 200a of the gate actuation circuit 200 is opened while the other switching element 200b of the gate actuation circuit 200 is closed. Furthermore, upon generation of this high-level output, the reference voltage of the hysteresis comparator 26 is changed from Vo to a lower value Vo' (i.e., Vo>Vo').

Accordingly, the output MOS transistor 2 and the current-detecting MOS transistor 3 are both turned off. No load current flows. Furthermore, no collector current flows across the PNP transistor 23. Thus, the capacitor 24 is discharged by the constant-current source 25. The terminal voltage of capacitor 24 is reduced. When the terminal voltage becomes smaller than the lower reference voltage Vo' of the hysteresis comparator 26, the hystresis comparator 26 generates a low-level output. This low-level output closes the switching element 200a of the gate actuation circuit 200 and at the same time opens the switching element 200b of the gate actuation circuit 200. Accordingly, the drain current again flows across the output MOS transistor 2.

As understood from the above-described operation, when the drain current of output MOS transistor 2 becomes large excessively, increased current flows across the NPN transistor 21 in the current-mirror circuit 300. An intermittent control circuit 400 comprises the constant-current source 22, PNP transistor 23, capacitor 24, constant-current source 25, and hystereis comparator 26. After a time elapse corresponding to a charge time for the capacitor 24, the intermittent control circuit 400 off-controls the gate actuation circuit 200 to deactivate the output MOS transistor 2. Subsequently, after a time elapse corresponding to a discharge time for the capacitor 24, the intermittent control circuit 400 on-controls the gate actuation circuit 200 to activate the output MOS transistor 2 again. By repeating such intermittent operations, the output MOS transistor 2 is intermittently turned on and off Accordingly, the loss in the output MOS transistor 2 is reduced significantly.

In the intermittent control circuit 400, the capacitor 24 and the constant-current source 25 cooperatively constitute a delay circuit. This is effective to prevent any malfunction of the circuit due to rush current flowing across the electrical load 1 at the beginning of an actuation for the electrical load 1. Thus, the load actuation circuit of the fifth embodiment is reliable in that it responds accurately to the excessive current but is non-responsive to the rush current. In other words, the presence of excessive current is recognized only when the output MOS transistor 2 is continuously subjected to large current for a duration exceeding a predetermined time. In response to true excessive current, the output MOS transistor 2 is intermittently turned on and off.

When the output MOS transistor 2 and the current-detecting MOS transistor 3 are both activated, there is a possibility that no current may flow across the diode 8. In such a case, it is difficult to equalize the gate-source voltage for the output MOS transistor 2 with the gate-source voltage for the current-detecting MOS transistor 3. The same operating point cannot be set for both of the MOS transistors 2 and 3. To avoid such a problem, this embodiment provides an impedance element 27, such as a resistor or a constant-current source, to assure the current always flowing across the diode 8.

Next, the arrangement of the gate actuation circuit 200 of the fifth embodiment will be explained with reference to FIG. 7.

Figure 7:
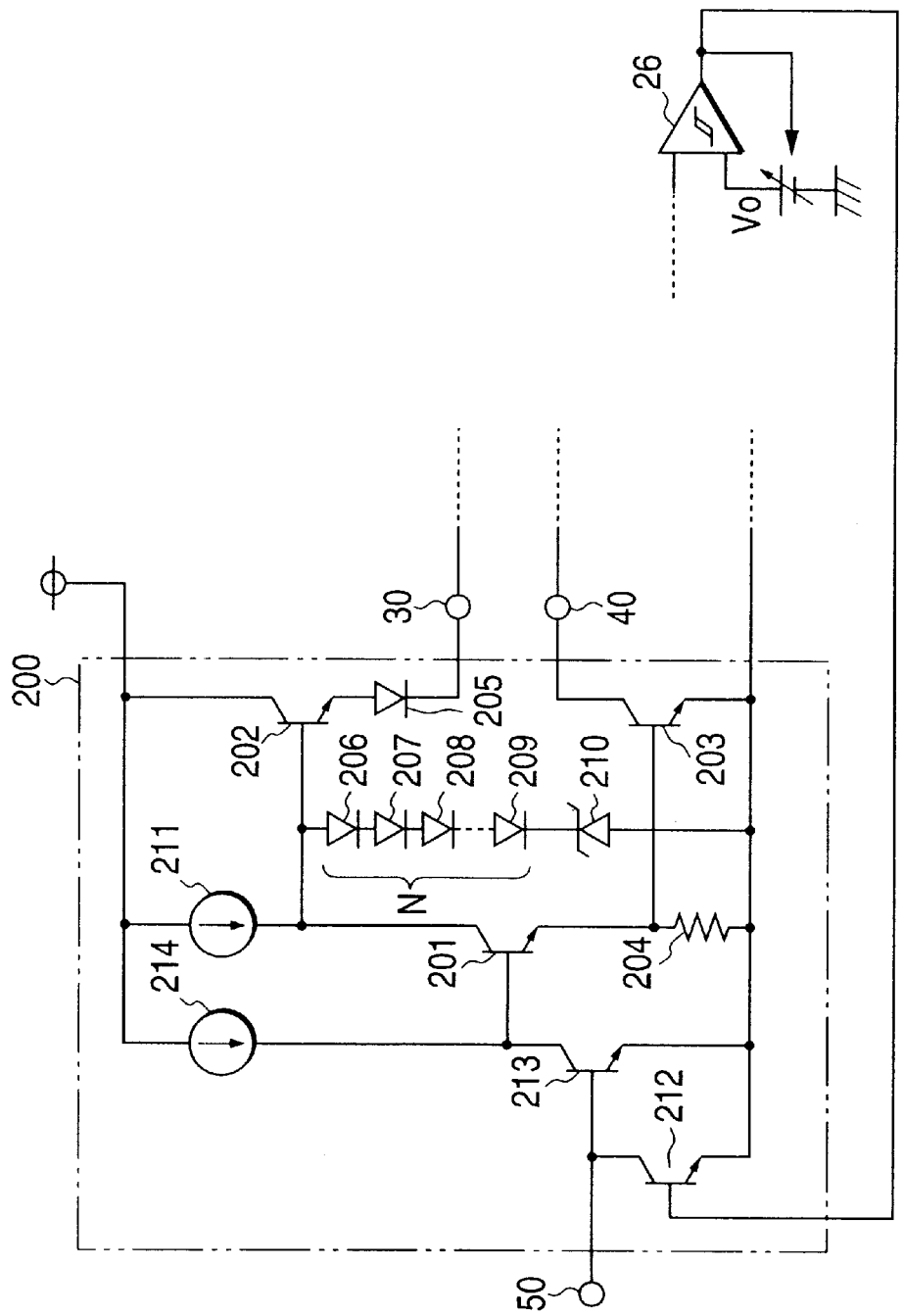
FIG. 7 is a circuit diagram showing a detailed arrangement of a gate actuation circuit shown in FIG. 6.

The gate actuation circuit 200 shown in FIG. 7 is different from the gate actuation circuit 200 shown in FIG. 2 in that two NPN transistors 212 and 213 and a constant-current source 214 are added between the terminal 50 and the NPN transistor 201. According to the arrangement shown in FIG. 7, when a high-level voltage is applied to the terminal 50, NPN transistor 213 is turned on and NPN transistor 201 is turned off. As a result, the output MOS transistor 2 is turned on. In other words, the arrangement of FIG. 7 is opposite to the arrangement of FIG. 2 in the voltage level setting for the terminal 50 to turn on and off the output MOS transistor 2.

In the load actuating condition, the output MOS transistor 2 is activated in response to the activation of NPN transistor 213. When the load current is increased excessively, the hysteresis comparator 26 of the intermittent control circuit 400 generates a high-level output. In response to this high-level output, NPN transistor 212 is turned on and NPN transistor 213 is turned off. Thus, the output MOS transistor 2 is turned off.

Sixth embodiment

According to the above-described fifth embodiment, the output MOS transistor 2 is intermittently turned on and off in response to the excessive current flowing across the output MOS transistor 2. This arrangement allows the excessive current to flow continuously across the output MOS transistor 2 during an on-duration of the output MOS transistor 2. Accordingly, the output MOS transistor 2 is subjected to a significant amount of heat generation.

Figure 8:
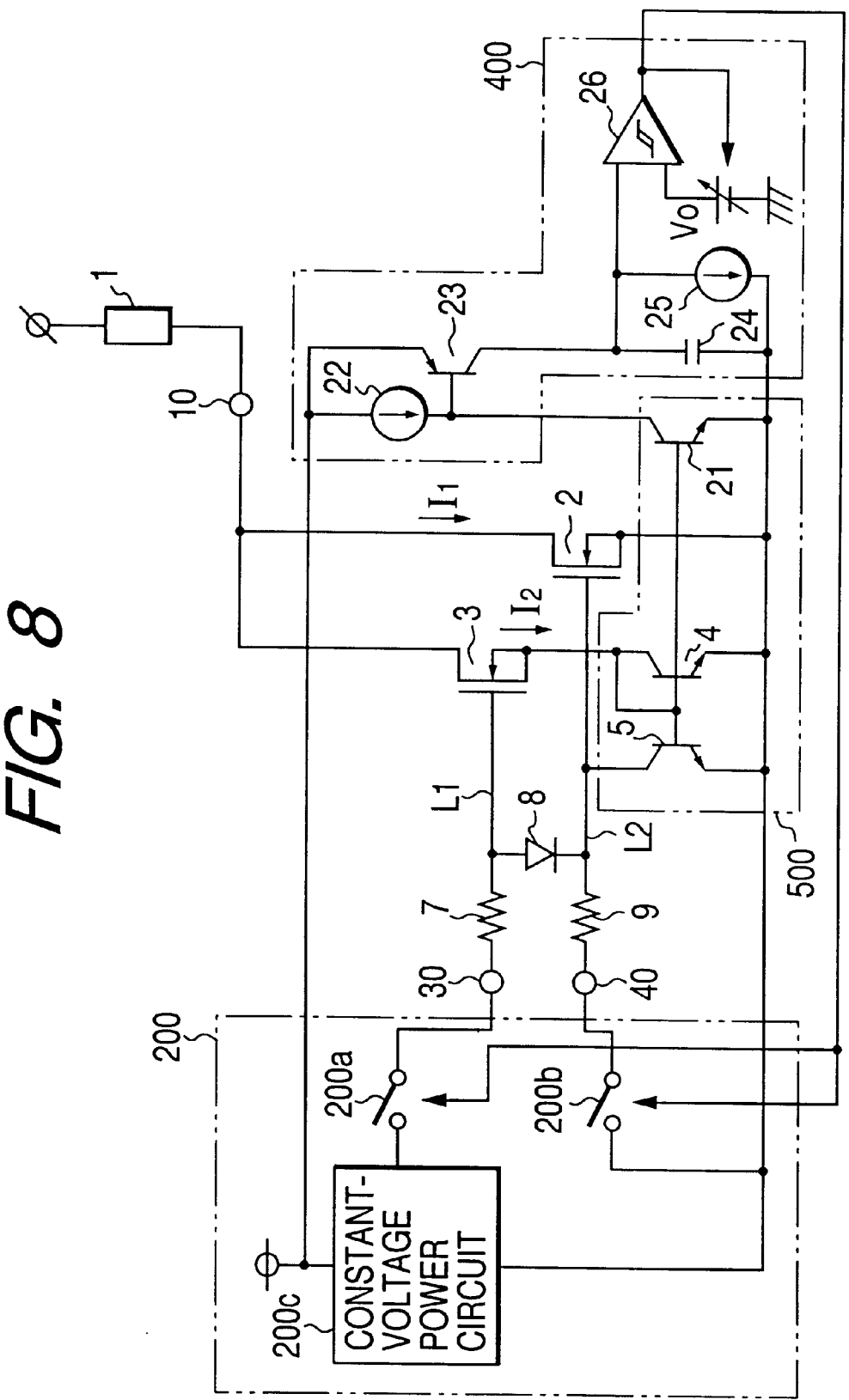
FIG. 8 is a circuit diagram showing a load actuation circuit is accordance with a sixth embodiment of the present invention.

In view of the above, the sixth embodiment performs a current-limit operation during the on-duration of the output MOS transistor 2 in the same manner as in the first embodiment. FIG. 8 shows a detailed circuit arrangement of the sixth embodiment.

NPN transistor 4 is connected to the source of the current-detecting MOS transistor 3. The base and the emitter of this NPN transistor 4 are connected to the base and the emitter of NPN transistor 5. These NPN transistors 4 and 5 cooperatively constitute a current-mirror circuit 500. Furthermore, a NPN transistor 21 is connected to the NPN transistor 4.

The intermittent control circuit 400 performs an intermittent control for output MOS transistor 2 only when the drain current of the output MOS transistor 2 becomes or exceeds a predetermined value, e.g., 3A. Meanwhile, the current-limit operation by NPN transistor 5 is initiated only when the drain current of the output MOS transistor 2 becomes or exceeds another predetermined value (e.g., 5A) which is larger than the setting current for the above-described intermittent control.

Figure 9:
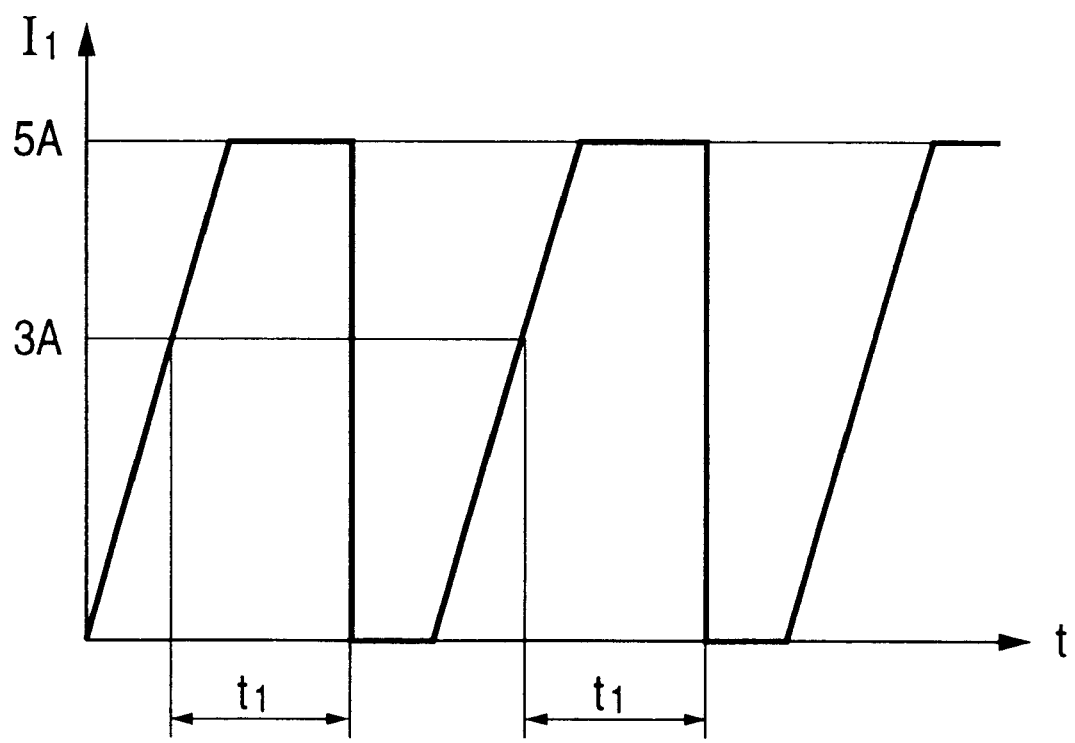
FIG. 9 is a view illustrating an operation of the sixth embodiment of the present invention.

According to the above-described arrangement, the drain current I1 of output MOS transistor 2 possibly exceeds 3A in accordance with an excessive increase of the load current, as shown in FIG. 9. The drain current I1 is limited within 5A for a predetermined interval t1 from the timing the drain current I1 exceeds 3A. This interval t1 is equivalent to a delay time by the capacitor 24. After the time t1 has elapsed, the output MOS transistor 2 is turned off. This cycle is repeated continuously.

Thus, the current-limit operation is surely performed during the on-duration in the turning on-off control of the output MOS transistor 2 by the intermittent control circuit 400. This is effective to reduce the heat generation in the output MOS transistor 2.

The gate actuation circuit 200 shown in FIG. 7 can be used in the above-described sixth embodiment.

Furthermore, the above-described fifth and sixth embodiments can incorporate a current-limiting circuit and other arrangement similar to those disclosed in the second and the fourth embodiments. For example, it is possible to use the P-channel type MOS transistors and the PNP transistors as shown in the embodiment of FIG. 4. Furthermore, it is possible to constitute all of NPN transistors 4, 5, 21, 23 and diode 8 by N-channel type MOS transistors as shown in FIG. 5.

Moreover, in the first to fourth embodiments, the current-limit operation is performed when the load current is excessively increased. The region for operating the current-mirror circuit can be set to an ordinary operating region. The load actuation circuit realized by this setting can actuate an electrical load with constant current.

Furthermore, in the above-described various embodiments, the output transistors and the current-detecting transistors are constituted by MOS transistors. However, these MOS transistors can be replaced by bipolar transistors.

Seventh embodiment

Figure 10:
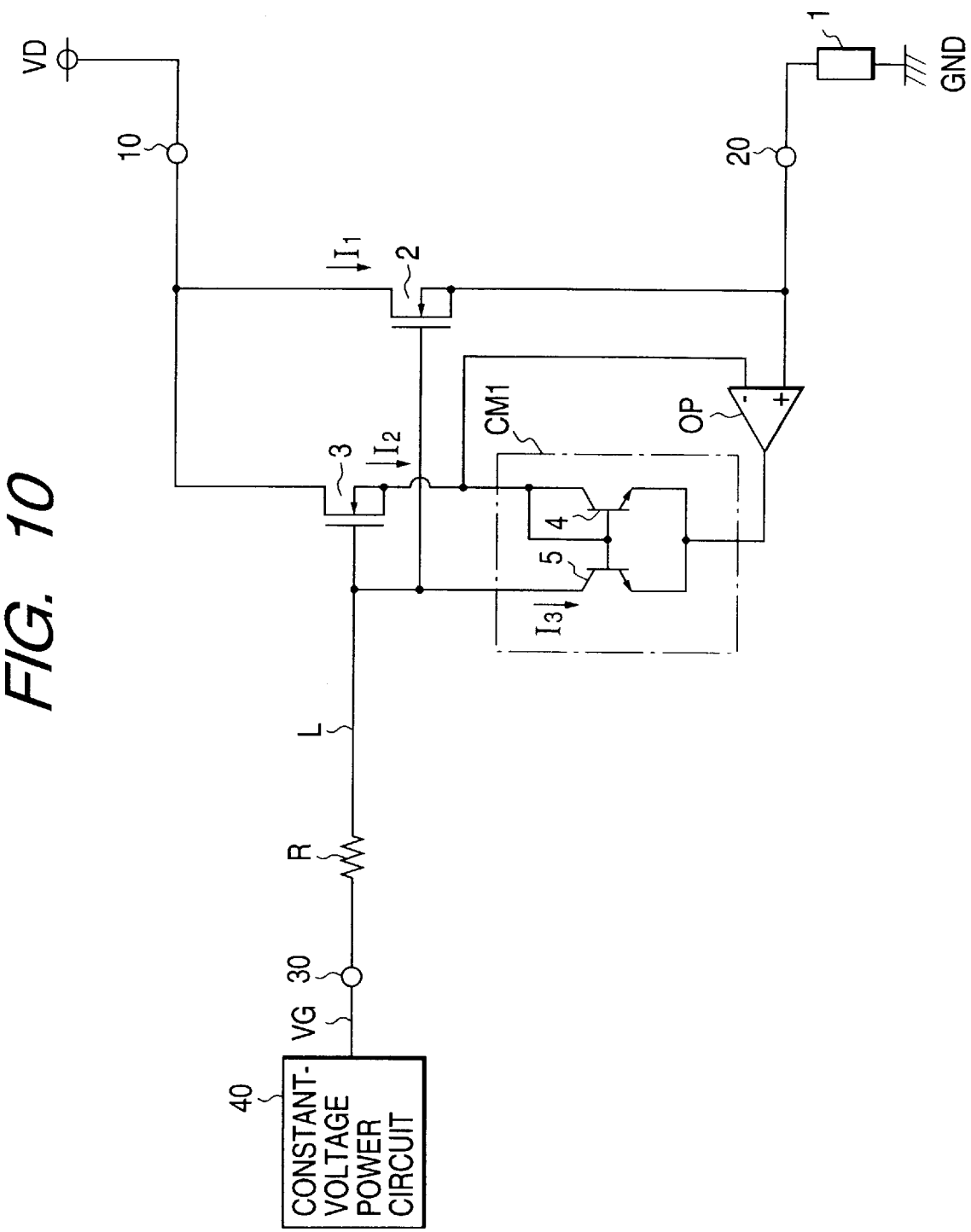
FIG. 10 is a circuit diagram showing a current-limiting circuit in accordance with a seventh embodiment of the present invention.

FIG. 10 is a circuit diagram showing a current-limiting circuit in accordance with the seventh embodiment.

As shown in FIG. 10, the current-limiting circuit in accordance with the seventh embodiment comprises an output transistor 2 having a drain and a source serially connected in a current path that supplies the load current to an electric load 1, a current-detecting transistor 3 identical in type and polarity with the output transistor 2 and having a drain and a gate respectively connected to the drain and a gate of the output transistor 2, and a signal line L feeding a gate voltage as a control signal via a resistor R to the gates of the output transistor 2 and the current-detecting transistor 3.

Furthermore, the current-limiting circuit of the seventh embodiment comprises an operational amplifier OP that has a non-inversion input terminal (i.e., plus terminal) connected to the source of the output transistor 2 and an inversion input terminal (i.e., minus terminal) connected to the source of the current-detecting transistor 3, a first transistor 4 having a collector and an emitter serially connected between the source of the current-detecting transistor 3 and the output terminal of the operational amplifier OP and having a base directly connected to the collector, and a second transistor 5 having a base and an emitter connected respectively to the base and the emitter of the first transistor 4 so that a current-mirror circuit CM 1 is constituted by the first transistor 4 and the second transistor 5 and the second transistor 5 having a collector connected to the signal line L.

According to the current-limiting circuit of this embodiment, all of the above-described components are formed on the same semiconductor chip. The output transistor 2 and the current-detecting transistor 3 are both N-channel type MOS transistors. The first transistor 4 and the second transistor 5 are both NPN-type bipolar transistors.

Furthermore, according to this embodiment, one end of the electrical load 1 is connected to a ground terminal (GND=0) having a second voltage potential. The drain of the output transistor 2 is connected via a terminal 10 to a power source voltage terminal VD (e.g., 5V) having a first voltage potential higher than the ground terminal. The source of the output transistor 2 is connected via a terminal 20 to the other terminal of the electrical load 1 opposed to the ground terminal. In short, the current-limiting circuit of the seventh embodiment has a high-side connecting arrangement characterized by the N-channel type MOS transistors connected to the higher-voltage side of the electrical load 1.

Moreover, the current-limiting circuit of this embodiment is connected via a terminal 30 to a constant-voltage power circuit 40. A resistor R is provided in the signal line L and connected to the terminal 30. The constant voltage power circuit 40 produces a predetermined constant voltage VG that is fed via the resistor R and the signal line L to the gates of output transistor and current-detecting transistor 3.

An operation of the above-described current-limiting circuit will be explained hereinafter.

When the electrical load 1 is not actuated, the constant-voltage power circuit 40 does not feed the constant voltage VG to the terminal 30. The output transistor 2 has the gate-source voltage of 0 V in this case, and therefore the output transistor 2 is turned off. No current flows across the electrical load 1.

On the other hand, when the electrical load 1 is actuated, the constant-voltage power circuit 40 supplies a high-level gate voltage via resistor R and signal line L to the gates of output transistor 2 and current-detecting transistor 3. Load current I1, supplied from the power source voltage terminal VD via output transistor 2 (from drain to source), flows across the electrical load 1.

In this case, the operational amplifier OP varies its output voltage (i.e., electrical potential of the output terminal) to set the same electrical potential for the sources of the output transistor 2 and the current-detecting transistor 3. Current I2 flows in response to the load current I1 from the power source voltage terminal VD to the output terminal of the operational amplifier OP via the current-detecting transistor 3 (from drain to source) and the first transistor 4 (form collector to emitter).

In other words, the operational amplifier OP has a function of setting the same electrical potential difference between any two terminals for both of the output transistor 2 and the current-detecting transistor 3. Accordingly, the output transistor 2 and the current-detecting transistor 3 have the same operating point in all of saturated and non-saturated operating regions. A ratio of load current I1 flowing across the output transistor 2 to current I2 flowing across the current-detecting transistor 3 is accurately dependent on a transistor size ratio between the transistor 2 and the transistor 3. This current I2 flows across the first transistor 4.

In response to the current I2, the second transistor 5 pulls in current I3 from the signal line L to the output terminal of the operational amplifier OP. The magnitude of the current I3 is a predetermined multiple to the current I2 flowing across the first transistor 4 (i.e., current flowing across the current-detecting transistor 3). A voltage drop proportional to this current I3 is caused at the resistor R. Therefore, the gate voltage applied to the output transistor 2 and the current-detecting transistor 3 is reduced by the amount corresponding to this voltage drop. Thus, the load current I1 controlled by the output transistor 2 is limited within a predetermined level.

A ratio (i.e., above-described predetermined multiple) of current I2 flowing across the first transistor 4 to current I3 flowing across the second transistor 5 is identical with the current-mirror ratio of the current-mirror circuit CM1 that is dependent on the transistor sizes of first and second transistors 4 and 5.

In the above-described current-limiting circuit of the seventh embodiment, the relationship between the load current I1 flowing across the output transistor 2 to current I2 flowing across the current-detecting transistor 3 is determined by the following equation. In this equation, "p" represents a ratio of the transistor size of output transistor 2 to the transistor size of current-detecting transistor 3.

$$I1 = p \times I2 \tag{8}$$

The current I3 flowing across the resistor R by the function of the second transistor 5 is expressed by the following equation. In this equation, "q" represents the current-mirror ratio of the current-mirror circuit CM 1.

$$I3 = q \times I2 \tag{9}$$

The gate-source voltage VGS of the output transistor 2 is expressed by the following equation. In this equation, "R0" represents a resistance value of the resistor R.

$$V_{GS} = VG - R0 \times I3 \tag{10}$$

From the above-described equations 8 through 10, the load current I1 flowing across the electrical load 1 under the control of the output transistor 2 is expressed by following equation.

$$I1 = (VG - V_{GS}) \times p / (q \times R0) \tag{11}$$

As understood from the equation 11, the load current I1 varies depending on the transistor size ratio p between output transistor 2 and current-detecting transistor 3, the current-mirror ratio q of the current-mirror circuit CM1, and the resistance value R0 of the resistor R. In other words, the load current I1 is independent from the power voltage supplied from power source voltage terminal VD and the drain-source voltage of the output transistor 2.

In the current-mirror circuit CM 1, the first and second transistors 4 and 5 mutually cancel their temperature characteristics. In the same manner, the output transistor 2 and the current-detecting transistor 3 mutually cancel their temperature characteristics. This means that the above-described equations are established no matter how the temperature is changed.

Accordingly, if the resistor R is excellent in the resistance value accuracy and temperature characteristics, the current-limit operation for the load current I1 will be performed accurately.

As explained in greater detail, the current-limiting circuit of the seventh embodiment is characterized in that, in the current-mirror circuit CM 1, the first and second transistors 4 and 5 mutually cancel their temperature characteristics and also in that the operational amplifier OP sets the same electrical potential difference between any two terminals for both of the output transistor 2 and the current-detecting transistor 3.

Accordingly, the above-described current-limiting circuit is robust against temperature change, and the current-limit operation for the load current I1 can be performed accurately by equalizing the operating point between the output transistor 2 and the current-detecting transistor 3.

Furthermore, according to the current-limiting circuit of the seventh embodiment, the current I2 flows across the current-detecting transistor 3 and the first transistor 4 in response to the load current I1 by the function of the operational amplifier OP even when the drain-source voltage of the output transistor 2 is substantially zero. Furthermore, the current I3 having magnitude equivalent to a predetermined multiple to the current I2 flows through the signal line L. Therefore, the current-limit operation can be performed in all operating regions of the output transistor 2. The limit value for the load current I1 can be set easily and variously.

Eighth embodiment

The above-described current-limiting circuit in accordance with the seventh embodiment is characterized in that the output transistor 2 of an N-channel type MOS transistor is connected to the higher-voltage side of the electrical load 1. The eighth embodiment described hereinafter is characterized by a low-side connecting arrangement wherein the output transistor 2 is connected to the lower-voltage side of the electrical load 1.

Figure 11:
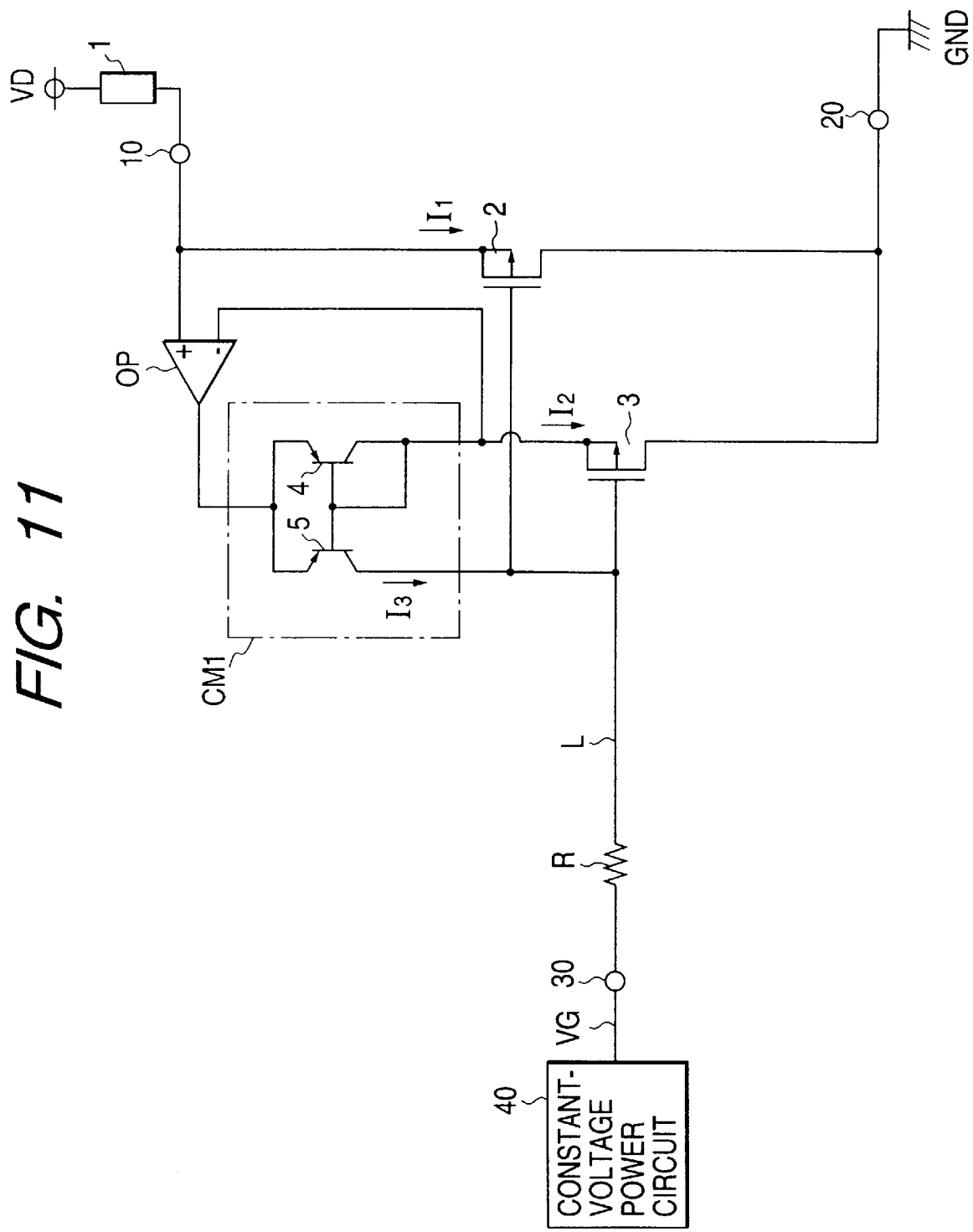
FIG. 11 is a circuit diagram showing a current-limiting circuit in accordance with an eighth embodiment of the present invention.

As shown in FIG. 11, the current-limiting circuit of the eighth embodiment is different from the current-limiting circuit of the seventh embodiment in the following three points (1) through (3). Other arrangements are substantially the same between the seventh and eighth embodiments.

(1) The output transistor 2 and the current-detecting transistor 3 are P-channel type MOS transistors.

(2) the first and second transistors 4 and 5, constituting the current-mirror circuit CM 1, are PNP type bipolar transistors.

(3) One end of the electrical load 1 is connected to the power source voltage terminal VD. The source of output transistor 2 is connected via a terminal 10 to the other terminal of the electrical load 1 opposed to the power source voltage terminal VD. The drain of the output transistor 2 is connected via a terminal 20 to the ground terminal (GND).

The above-described current-limiting circuit of the eighth embodiment is different from the current-limiting circuit of the seventh embodiment in that the direction of current flowing across each component is opposite. However, the current-limiting operation is performed in the same manner in each of seventh and eighth embodiments.

More specifically, when the electrical load 1 is actuated, the constant voltage power circuit 40 produces a low-level gate voltage lower than the power voltage of the power source voltage terminal VD. This gate voltage is fed via resistor R and signal line L to the gates of output transistor 2 and current-detecting transistor 3. In response to this gate voltage, the output transistor 2 is turned on to allow current to flow from the other terminal of electrical load 1 opposed to the power source voltage terminal VD via this output transistor 2 (from source to drain) to the ground terminal. Therefore, the load current I1 flows across the electrical load 1.

In this case, the operational amplifier OP varies its output voltage to set the same electrical potential for the sources of output transistor 2 and current-detecting transistor 3. Current I2 flows in response to the load current I1 from the output terminal of operational amplifier OP to the ground terminal via the first transistor 4 (form emitter to collector) and the current-detecting transistor 3 (from source to drain). Furthermore, the second transistor 5 pulls in the current I3 from the output terminal of operational amplifier OP to the signal line L. The magnitude of current I3 is a predetermined multiple to the current I2. A voltage rise proportional to this current I3 is caused at the resistor R. Therefore, the gate voltage applied to the output transistor 2 and the current-detecting transistor 3 is increased by the amount corresponding to this voltage rise. Thus, the load current I1 controlled by the output transistor 2 is limited within a predetermined level.

The current-limiting circuit of the eighth embodiment is substantially identical with the current-limiting circuit of the seventh embodiment in that, in the current-mirror circuit CM1, the first and second transistors 4 and 5 mutually cancel their temperature characteristics, and in that the operational amplifier OP sets the same electrical potential difference between any two terminals for both of the output transistor 2 and the current-detecting transistor 3. Thus, the current-limiting circuit of the eighth embodiment is robust against temperature change, and the current-limit operation for the load current I1 can be performed accurately by equalizing the operating point between the output transistor 2 and the current-detecting transistor 3.

However, in the current-limiting circuit of the seventh embodiment wherein both of the output transistor 2 and the current-detecting transistor 3 are constituted by N-channel type MOS transistors, it is possible to connect the output transistor 2 to the lower-voltage side of the electrical load 1 as shown in the eighth embodiment. In this case, the source of the output transistor 2 is connected to the ground terminal. This forces the operational amplifier OP to produce a voltage lower than the ground terminal (0V). Therefore, a voltage lower than 0V needs to be prepared as a power source voltage specially for the operational amplifier OP.

In the same manner, in the current-limiting circuit of the eighth embodiment wherein both of the output transistor 2 and the current-detecting transistor 3 are constituted by P-channel type MOS transistors, it is possible to connect the output transistor 2 to the higher-voltage side of the electrical load 1 as shown in the seventh embodiment. In this case, the source of the output transistor 2 is connected to the power source voltage terminal VD. This forces the operational amplifier OP to produce a voltage higher than the power source voltage of the power source voltage terminal VD.

Therefore, a voltage higher than the power source voltage needs to be prepared as a power source voltage specially for the operational amplifier OP.

Accordingly, the later-described ninth embodiment of the present invention provides a novel arrangement that requires no special power source voltage for the operational amplifier OP even when both of the output transistor 2 and the current-detecting transistor 3 are constituted by N-channel type MOS transistors and the output transistor 2 is connected to the lower-voltage side of the electrical load 1. Moreover, the later-described tenth embodiment of the present invention provides a novel arrangement that requires no special power source voltage for the operational amplifier OP even when both of the output transistor 2 and the current-detecting transistor 3 are constituted by P-channel type MOS transistors and the output transistor 2 is connected to the higher-voltage side of the electrical load 1.

Ninth embodiment

Figure 12:
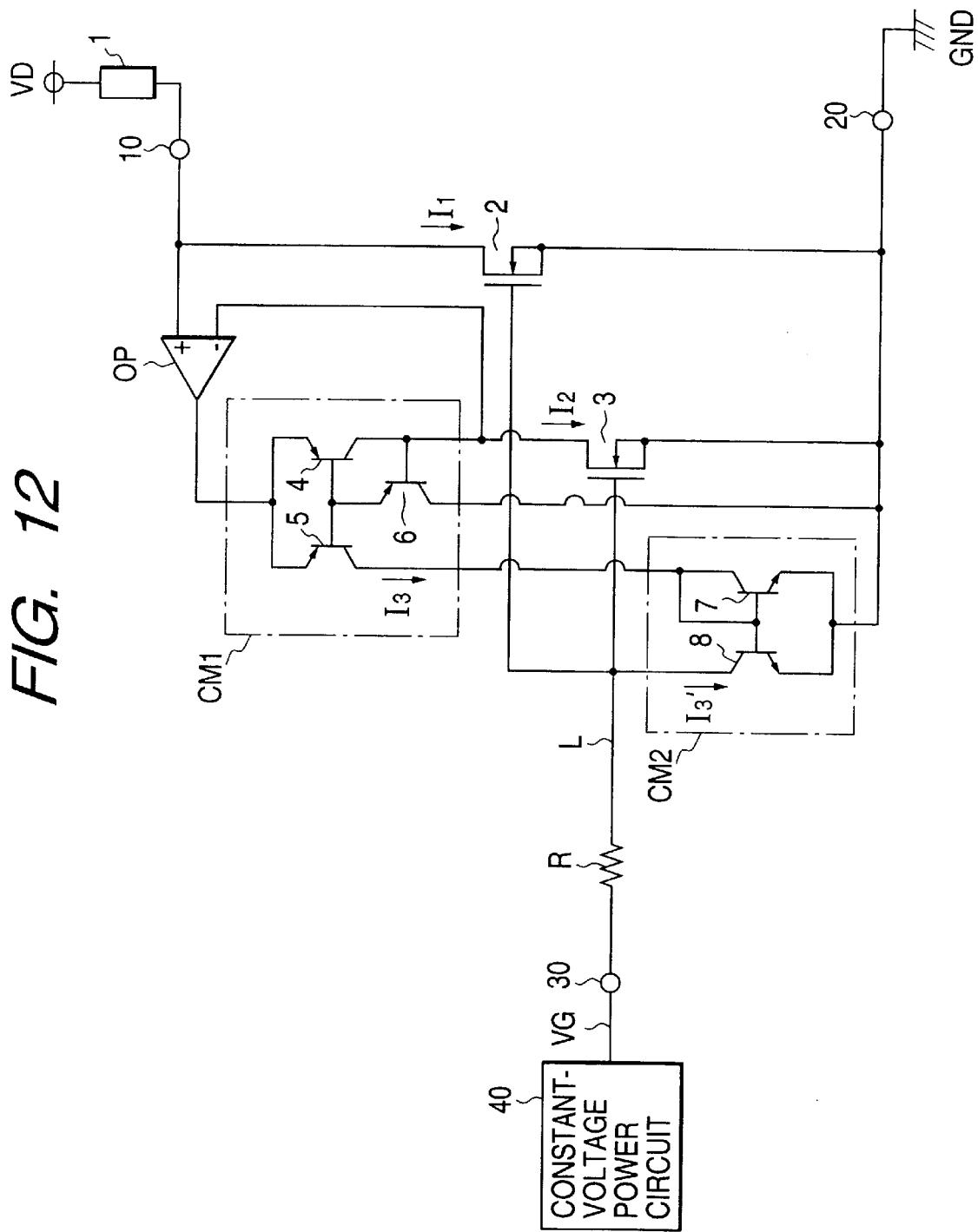
FIG. 12 is a circuit diagram showing a current-limiting circuit in accordance with a ninth embodiment of the present invention.

As shown in FIG. 12, the current-limiting circuit of the ninth embodiment is different from the current-limiting circuit of the seventh embodiment in the following three points (A) through (C).

(A) The source of output transistor 2 is connected to the source of current-detecting transistor 3, while the gate of output transistor 2 is connected to the gate of current-detecting transistor 3. The drain of output transistor 2 is connected to the non-inversion input terminal of the operational amplifier OP, while the drain of current-detecting transistor 3 is connected to the inversion input terminal of the operational amplifier OP. The drain of output transistor 2 is connected to the electrical load 1 at an end opposed to the power source voltage terminal VD. The source of output transistor 2 is connected to the ground terminal.

(B) First transistor 4 and second transistor 5, cooperatively constituting the current-mirror circuit CM1, are both PNP-type bipolar transistors. The collector of first transistor 4 is connected to the drain of current-detecting transistor 3. In the current-mirror circuit CM1, the collector of first transistor 4 is not directly connected to its base. Instead, a potential-difference producing transistor 6 is added. This potential-difference producing transistor 6 is a PNP type bipolar transistor having an emitter connected to the bases of the first an second transistors 4 and 5, a base connected to the collector of first transistor 4, and a collector connected to the sources (i.e., ground terminal in this ninth embodiment) of output transistor 2 and current-detecting transistor 3.

(C) Furthermore, according to the current-limiting circuit of the ninth embodiment, a secondary current-mirror circuit CM2 consisting of a third transistor 7 and a fourth transistor 8 is provided. The third transistor 7 has a collector and a base connected to the collector of second transistor 5 and an emitter connected to the sources of output transistor 2 and current-detecting transistor 3. The fourth transistor 8 has a base connected to the base of third transistor 7, an emitter connected to the emitter of third transistor 7, and a collector connected to the signal line L. These third and fourth transistors 7 and 8 are constituted by NPN-type bipolar transistors.

According to the above-described current-limiting circuit of the ninth embodiment, current flows from the end of electrical load 1 opposed to the power source voltage terminal VD via the output transistor 2 (from drain to source) to the ground terminal. Thus, the load current I1 flows across the electrical load 1.

Then, the operational amplifier OP varies its output voltage to set the same electrical potential for the drains of output transistor 2 and current-detecting transistor 3. Current I2 flows in response to the load current I1 from the output terminal of operational amplifier OP to the ground terminal via the first transistor 4 (form emitter to collector) and the current-detecting transistor 3 (from drain to source). Meanwhile, the current I3, whose magnitude is equivalent to a predetermined multiple to the current I2, flows from the output terminal of operational amplifier OP to the ground terminal via the second transistor 5 (form emitter to collector) and the third transistor 7 (from collector to emitter).

The fourth transistor 8, associated with the third transistor 7 to constitute the secondary current-mirror circuit CM2, is responsive to the current I3 and pulls in current I3' from the signal line L to the ground terminal. The magnitude of the current I3' is a predetermined multiple to the current I3 flowing across the second transistor 5 and the third transistor 7. A voltage drop proportional to this current I3' is caused at the resistor R. Therefore, the gate voltage applied to the output transistor 2 and the current-detecting transistor 3 is reduced by the amount corresponding to this voltage drop. Thus, the load current I1 controlled by the output transistor 2 is limited within a predetermined level.

A ratio (i.e., above-described predetermined multiple) of current I3 flowing across the third transistor 7 to current I3' flowing across the fourth transistor 8 is identical with the current-mirror ratio of the secondary current-mirror circuit CM2 that is dependent on the transistor sizes of third and fourth transistors 7 and 8. This current-mirror ratio can be set to 1 or any other value.

As described above, the current-limiting circuit of the ninth embodiment is characterized by the low-side connecting arrangement wherein the N-channel MOS transistors are connected to the lower-voltage side of the electrical load 1. More specifically, the source of output transistor 2 is connected to the source of current-detecting transistor 3, and the gate of output transistor 2 is connected to the gate of current-detecting transistor 3. The drain of output transistor 2 is connected to the non-inversion input terminal of operational amplifier OP, while the drain of current-detecting transistor 3 is connected to the inversion input terminal of operational amplifier OP. Furthermore, the secondary current-mirror circuit CM2, serving as a current pull-in means, is provided to reverse the direction of current I3 flowing across the second transistor 5 and pull in the current I3' from the signal line L.

The above-described current-limiting circuit of the ninth embodiment is similar to the current-limiting circuit of the eight embodiment shown in FIG. 11 in that no special power source voltage is required for the operational amplifier OP because the output voltage of the operational amplifier OP needs not vary beyond the potential range between the power source voltage terminal VD and the ground terminal.

Furthermore, according to the current-limiting circuit of the ninth embodiment, the secondary current-mirror circuit CN2 consisting of third and fourth transistors 7 and 8 has a function of pulling in the current from the signal line L. This is effective to maintain accuracy in the current-limiting operation for the load current I1.

Still further, according to the current-limiting circuit of the ninth embodiment, the current-mirror circuit CM1 is characterized in that the collector and the base of first transistor 4 are not directly connected. Instead, the potential-difference producing transistor 6 is added as a potential-difference producing means. This is advantageous in that the current-limiting operation can be performed even when the drain-source voltage of output transistor 2 is substantially 0V.

Hereinafter, the reasons will be explained in greater detail.

First, in FIG. 12, if the potential-difference producing transistor 6 is not provided, the collector and the base of first transistor 4 may be directly connected. In such a case, an electrical potential difference about 0.6 V is caused between the output terminal of operational amplifier OP and the drain of current-detecting transistor 3. This electrical potential difference is equivalent to the base-emitter voltage of the first transistor 4. When the drain-source voltage of the output transistor 2 is 0V, the drain-source voltage of the current-detecting transistor 3 becomes 0V according to this embodiment. Therefore, the electrical potential difference between the output terminal of operational amplifier OP and the source of current-detecting transistor 3 becomes about 0.6 V.

However, according to the current-limiting circuit of the ninth embodiment, the second transistor 5 and the third transistor 7 are connected in series between the output terminal of operational amplifier OP and the source of current-detecting transistor 3. As described above, the second transistor 5 is associated with the first transistor 4 to constitute the current-mirror circuit CM1, while the third transistor 7 constitutes the secondary current-mirror circuit CM2. Operating both of the second transistor 5 and the third transistor 7 is impossible by the above-described potential difference of about 0.6V applied between the output terminal of operational amplifier OP and the source of current-detecting transistor 3. Thus, the current-limit operation cannot be performed.

This is why the potential-difference producing transistor 6 is provided as shown in FIG. 12. According to the arrangement of FIG. 12, an electrical potential difference of about 1.2V is generated between the output terminal of operational amplifier OP and the source of current-detecting transistor 3 even when the drain-source voltage of output transistor 2 is 0V. The electrical potential difference of about 1.2V is equivalent to a sum of the base-emitter voltage of first transistor 4 and the base-emitter voltage of the potential-difference producing transistor 6 (i.e., the base-emitter voltage of third transistor 7). Accordingly, it becomes possible to assure the operation of second transistor 5 and third transistor 7 even when the drain-source voltage of output transistor 2 is 0V. The previously-described current-limit operation can be performed surely.

Removing the potential-difference producing transistor 6 from the circuit arrangement of FIG. 12 will be possible if the collector and the base of first transistor 4 are directly connected and a diode is interposed in a forward direction in a current path extending from the connecting point of the collector and the base of first transistor 4 to a connecting point of the drain of current-detecting transistor 3 and the inversion input terminal of the operational amplifier OP. Providing the potential-difference producing transistor 6 shown in FIG. 12 is advantageous in that the current-mirror ratio of current-mirror circuit CM1 can be set accurately.

Tenth embodiment

Figure 13:
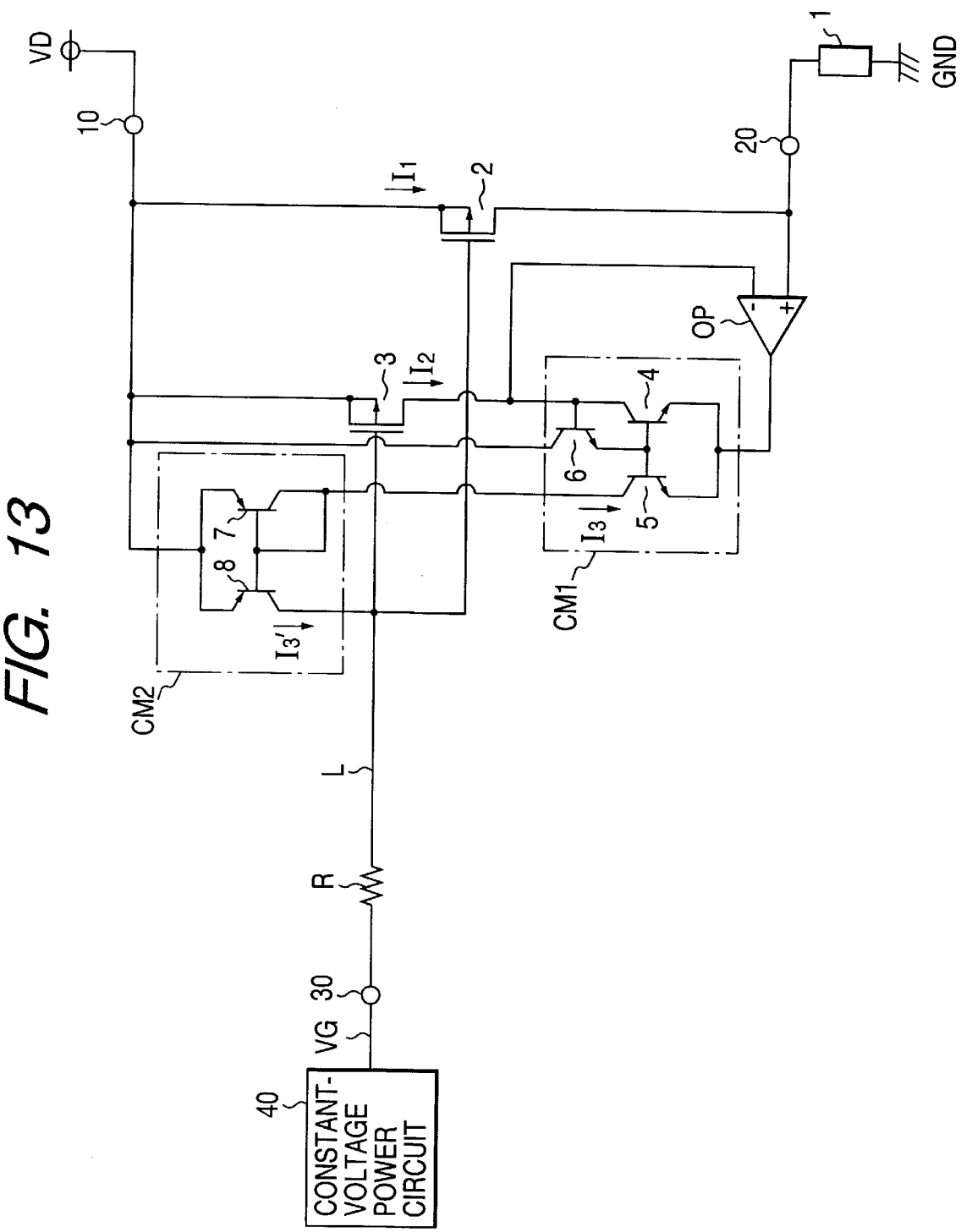
FIG. 13 is a circuit diagram showing a current-limiting circuit in accordance with a tenth embodiment of the present invention.

As shown in FIG. 13, the current-limiting circuit of the tenth embodiment is different from the current-limiting circuit of the ninth embodiment in the following three points (a) through (c).

(a) The output transistor 2 and the current-detecting transistor 3 are both constituted by P-channel MOS transistors.

(b) First and second transistors 4 and 5, cooperatively constituting the current-mirror circuit CM1, are constituted by NPN-type bipolar transistors. The potential-difference producing transistor 6 is constituted by an NPN-type bipolar transistor.

Furthermore, third and fourth transistors 7 and 8, cooperatively constituting the secondary current-mirror circuit CM2, are constituted by PNP-type bipolar transistors.

(c) One end of the electrical load 1 is connected to the ground terminal. The source of output transistor 2 is connected via terminal 10 to the power source voltage terminal VD. The drain of output transistor 2 is connected via terminal 20 to the electrical load 1 at an end opposed to the ground terminal.

The above-described current-limiting circuit of the tenth embodiment is different from the current-limiting circuit of the ninth embodiment in that the direction of current flowing across each component is opposite. However, the current-limiting operation is performed in the same manner in each of the ninth and tenth embodiments.

More specifically, the load current I1, supplied from the power source voltage terminal VD via output transistor 2 (from source to drain), flows across the electrical load 1. In this case, the operational amplifier OP varies its output voltage to set the same electrical potential for the drains of the output transistor 2 and the current-detecting transistor 3. Current I2 flows in response to the load current I1 from the power source voltage terminal VD to the output terminal of the operational amplifier OP via the current-detecting transistor 3 (from source to drain) and the first transistor 4 (form collector to emitter). Meanwhile, the current I3, whose magnitude is equivalent to a predetermined multiple to the current I2, flows from the power source voltage terminal VD to the output terminal of the operational amplifier OP via the third transistor 7 (from emitter to collector) and the second transistor 5 (from collector to emitter).

The fourth transistor 8, associated with the third transistor 7 to constitute the secondary current-mirror circuit CM2, is responsive to the current I3 and sends out current I3' from the power source voltage terminal to the signal line L. The magnitude of the current I3' is a predetermined multiple to the current I3 flowing across the second transistor 5 and the third transistor 7. A voltage rise proportional to this current I3' is caused at the resistor R. Therefore, the gate voltage applied to the output transistor 2 and the current-detecting transistor 3 is increased by the amount corresponding to this voltage rise. Thus, the load current I1 controlled by the output transistor 2 is limited within a predetermined level.

As described above, the current-limiting circuit of the tenth embodiment is characterized by the high-side connecting arrangement wherein the P-channel MOS transistors are connected to the higher-voltage side of the electrical load 1. More specifically, the source of output transistor 2 is connected to the source of current-detecting transistor 3, and the gate of output transistor 2 is connected to the gate of current-detecting transistor 3. The drain of output transistor 2 is connected to the non-inversion input terminal of operational amplifier OP, while the drain of current-detecting transistor 3 is connected to the inversion input terminal of operational amplifier OP. Furthermore, the secondary current-mirror circuit CM2, serving as a current send-out means, is provided to reverse the direction of current I3 flowing across the second transistor 5 and send out the current I3' to the signal line L.

The above-described current-limiting circuit of the tenth embodiment is similar to the current-limiting circuit of the seventh embodiment shown in FIG. 10 in that no special power source voltage is required for the operational amplifier OP because the output voltage of the operational amplifier OP needs not vary beyond the potential range between the power source voltage terminal VD and the ground terminal.

Furthermore, the current-limiting circuit of the tenth embodiment comprises the secondary current-mirror circuit CM2 consisting of third and fourth transistors 7 and 8 in the same manner as in the ninth embodiment. This secondary current-mirror circuit CM2 has a function of sending out the current to the signal line L. This is effective to maintain accuracy in the current-limiting operation for the load current I1.

Still further, according to the current-limiting circuit of the tenth embodiment, the current-mirror circuit CM1 is characterized in that the collector and the base of first transistor 4 are not directly connected. Instead, the potential-difference producing transistor 6 is added as a potential-difference producing means. This is advantageous in that the current-limiting operation can be performed even when the drain-source voltage of output transistor 2 is substantially 0V.

Other modifications

According to the above-described seventh to tenth embodiments, the current-mirror circuit CM1 is constituted by bipolar transistors. However, the current-mirror circuit CM1 can be constituted by MOS transistors.

Furthermore, the current-mirror circuit CM2 can be constituted by MOS transistors, for example, in the ninth embodiment. In this case, i.e., when third and fourth transistors 7 and 8 are constituted by MOS transistors, it is necessary to provide an electrical potential difference between the base of first and second transistors 4 and 5 cooperatively constituting the current-mirror circuit CM1 and the drain of current-detecting transistor 3. This electrical potential difference is equivalent to the gate-source voltage of the third transistor 7 constituted by a MOS transistor.

More specifically, in FIG. 12, the potential-difference producing transistor 6 constituted by a PNP transistor is replaced by a P-channel type MOS transistor having a source connected to the bases of first and second transistors 4 and 5, a gate connected to the collector of first transistor 4, and a drain connected to the sources of output transistor 2 and current-detecting transistor 3. Instead of using this kind of P-channel type MOS transistor, it is possible to directly connect the collector and the base of first transistor 4 and insert a MOS transistor in series in a current path extending from the connecting point of the collector and the base of first transistor 4 and to a correcting point of the drain of current-detecting transistor 3 and the non-inversion input terminal of operational amplifier OP. In this case, the gate and the drain of this MOS transistor are connected directly. Thus, an electrical potential difference corresponding to the gate-source voltage of the third transistor 7 is caused in this current path.

On the other hand, in each current-limiting circuit in the above-described embodiments, the output transistor 2 and the current-detecting transistor 3 are constituted by MOS transistors. It is of course possible to constitute the output transistor 2 and the current-detecting transistor 3 by bipolar transistors. In this case, however, the drain is replaced by the collector, the source is replaced by the emitter, and the gate is replaced by the base in the circuit arrangement.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. A load actuation circuit comprising:
    an output transistor supplying load current to an electrical load;
    a current-detecting transistor connected in parallel with said output transistor and having a control terminal connected to a control terminal of said output transistor;
    a signal line feeding a control signal to the control terminal of said output transistor and said current-detecting transistor via a resistor;
    a first transistor connected in series with said current-detecting transistor;
    a second transistor associated with said first transistor to constitute a current-mirror circuit, said second transistor being connected to the control terminal of said output transistor; and
    said current-mirror circuit being responsive to part of the load current flowing across said first transistor via said current-detecting transistor and allowing derivative current flowing across said second transistor by a predetermined ratio with respect to said part of the load current flowing across said first transistor;
    whereby the voltage level of said control signal fed to said output transistor and said current-detecting transistor varies in response to a voltage change occurring at said resistor in accordance with the current flowing across said signal line that is identical with said derivative current flowing across said second transistor, so that said derivative current directly controls said load current within a predetermined level.

2. The load actuation circuit in accordance with claim 1, wherein said output transistor is an output MOS transistor having a drain and a gate connected respectively to a drain and a gate of a current-detecting MOS transistor serving as said current-detecting transistor, and a collector of said first transistor is connected to a source of said current-detecting MOS transistor.

3. The load actuation circuit in accordance with claim 2, wherein both of said output MOS transistor and said current-detecting MOS transistor are N-channel type MOS transistors that cooperatively act to pull in the current from said signal line to said second transistor.

4. The load actuation circuit in accordance with claim 2, wherein both of said output MOS transistor and said current-detecting MOS transistor are P-channel type MOS transistors that cooperatively act to send out the current from said second transistor to said signal line.

5. The load actuation circuit in accordance with claim 2, wherein said first and second transistors are constituted by first and second bipolar transistors connected commonly at their bases and emitters, and a collector of said first bipolar transistor is directly connected to the source of said current-detecting MOS transistor and said common base, and an emitter of said first bipolar transistor is connected to the source of said output MOS transistor, while a collector of said second bipolar transistor is directly connected to said signal line.

6. The load actuation circuit in accordance with claim 5, wherein said signal line comprises a first signal line feeding said control signal to a gate of said current-detecting MOS transistor via said resistor and a second signal line feeding said control signal to a gate of said output MOS transistor from an intermediate point between said gate of said current-detecting MOS transistor and said resistor, and voltage drop means is provided in said second signal line to cause a voltage drop substantially identical with a base-emitter voltage of said first bipolar transistor.

7. The load actuation circuit in accordance with claim 6, wherein said voltage drop means is a semiconductor element generating a forward voltage by using a PN junction.

8. The load actuation circuit in accordance with claim 7, farther comprising discharge means for discharging the gate of said output MOS transistor when said output MOS transistor is turned off.

9. The load actuation circuit in accordance with claim 2, wherein said first and second transistors are constituted by first and second MOS transistors having a common gate and a common source, and a drain of said first MOS transistor is connected to the source of said current-detecting MOS transistor and said common gate, and a source of said first MOS transistor is connected to the source of said output transistor, while a drain of said second MOS transistor is connected to said signal line.

10. The load actuation circuit in accordance with claim 9, wherein said signal line comprises a first signal line feeding said control signal to a gate of said current-detecting MOS transistor via said resistor and a second signal line feeding said control signal to a gate of said output MOS transistor from an intermediate point between said gate of said current-detecting MOS transistor and said resistor, and voltage drop means is provided in said second signal line to cause a voltage drop substantially identical with a gate-source voltage of said first MOS transistor.

11. The load actuation circuit in accordance with claim 10, wherein said voltage drop means is a MOS transistor having a gate-source voltage causing said voltage drop.

12. The load actuation circuit in accordance with claim 11, further comprising discharge means for discharging the gate of said output MOS transistor when said output MOS transistor is turned off.

13. The load actuation circuit in accordance with claim 1, further comprising:
 a third transistor constituting a current-mirror circuit together with said first and second transistors; and
 an intermittent control circuit that is responsive to current flowing across said third transistor to detect the load current, and said intermittent control circuit turns off both of said output transistor and said current-detecting transistor in response to a detection of excessive load current, and then said intermittent control circuit turns on both of said output transistor and said current-detecting transistor in response to an elimination of said excessive load current.

14. The load actuation circuit in accordance with claim 13, wherein said intermittent control circuit comprises a delay circuit that turns off both of said output transistor and said current-detecting transistor in response to an elapse of a predetermined time after said detection of the excessive load current.

15. The load actuation circuit in accordance with claim 1, wherein said derivative current flowing across said second transistor varies linearly in response to said load current.

16. A load actuation circuit comprising:
 an output transistor having a control terminal as well as one and other terminals for inputting and outputting current, to supply load current to an electrical load;
 a current-detecting transistor having a control terminal as well as one and other terminals for inputting and outputting current, said one terminal being connected to said one terminal of said output transistor;
 said output transistor and said current-detecting transistor respectively performing a current-supply operation in response to a control voltage applied between the control terminal and said other terminal thereof;
 a first signal line feeding a control signal to the control terminal of said current-detecting transistor via a resistor;
 a second signal line feeding said control signal to the control terminal of said current-detecting transistor from an intermediate point between said resistor and said control terminal of said current-detecting transistor;
 a current-control transistor connected in series with said current-detecting transistor, so that said current-control transistor and said current-detecting transistor are connected in parallel with said output transistor;
 said current-control transistor allowing part of said load current to flow across said current-detecting transistor as a detection current when the load current exceeds a predetermined value;
 a current-limiting circuit including said current-control transistor and varying a voltage level of said control signal in response to an operation of said current-control transistor, to limit the load current within a predetermined level; and
 voltage-drop means provided in said second signal line for causing a voltage drop substantially identical with a voltage applied between the other terminal of said current-detecting transistor and the other terminal of said output transistor when said current-control transistor is operated.

17. The load actuation circuit in accordance with claim 16, wherein said current-control transistor is a bipolar transistor, and said voltage-drop means is a semiconductor element generating a forward voltage by using a PN junction.

18. The load actuation circuit in accordance with claim 16, wherein said current-control transistor is a MOS transistor, and said voltage-drop means is a MOS transistor having a gate-source voltage generating said voltage drop.

19. A load actuation circuit comprising:
 an output transistor supplying load current to an electrical load;
 a current-detecting transistor connected in parallel with said output transistor and having a control terminal connected to a control terminal of said output transistor;
 a first transistor connected in series with said current-detecting transistor;
 a second transistor associated with said first transistor to constitute a current-mirror circuit; and
 an intermittent control circuit that is responsive to current flowing across said second transistor to detect the load current, and said intermittent control circuit turns off both of said output transistor and said current-detecting transistor in response to a detection of excessive load current, and then said intermittent control circuit turns on both of said output transistor and said current-detecting transistor in response to an elimination of said excessive load current.

20. The load actuation circuit in accordance with claim 19, wherein said intermittent control circuit comprises a delay circuit that turns off both of said output transistor and said current-detecting transistor in response to an elapse of a predetermined time after said detection of the excessive load current.

21. The load actuation circuit in accordance with claim 19, wherein said output transistor is an output MOS transistor having a drain and a gate connected respectively to a drain and a gate of a current-detecting MOS transistor serving as said current-detecting, transistor;

a gate actuation circuit is provided for feeding a gate voltage to said output MOS transistor and said current-detecting MOS transistor; and said intermittent control circuit controls said gate actuation circuit to turn on and off said output MOS transistor and said current-detecting MOS transistor.

22. The load actuation circuit in accordance with claim 19, further comprising a third transistor associated with said first and second transistors to constitute said current-mirror circuit, so that the load current flowing across said output transistor is limited within a predetermined level in accordance with current flowing across said third transistor.

23. A current-limiting circuit comprising:

an output transistor having a control terminal for receiving a control signal and first and second output terminals for inputting and outputting current, said first and second output terminals being connected in series with an electrical load between a first voltage terminal and a second voltage terminal, said second voltage terminal having an electrical potential lower than that of said first voltage terminal; a current-detecting transistor identical in type and polarity with said output transistor, a first output terminal of said current-detecting transistor being connected to said first output terminal of said output transistor while a control terminal of said current-detecting transistor being connected to the control terminal of said output transistor;

a signal line feeding the control signal via a resistor to said control terminals of said output transistor and said current-detecting transistor;

an operational amplifier having a non-inversion input terminal connected to the second output terminal of said output transistor, and an inversion input terminal connected to the second output terminal of said current-detecting transistor;

a first transistor having two output terminals connected in series between the second output terminal of sais current-detecting transistor and an output terminal of said operational amplifier; and a second transistor associated with said first transistor to constitute a current-mirror circuit, so that current flowing across said second transistor becomes a predetermined multiple to the current flowing across said first transistor via said current-detecting transistor, whereby a voltage change is caused at the resistor in accordance with said current flowing through said signal line by the function of said second transistor, and a voltage level of said control signal is varied in accordance with said voltage change, thus load current controlled by said output transistor and supplied to said-electrical load is limited within a predetermined level.

24. The current-limiting circuit in accordance with claim 23, wherein said output transistor and said current-detecting transistor are constituted by N-channel type MOS transistors, so as to pull in the current flowing across said second transistor from said signal line.

25. The current-limiting circuit in accordance with claim 24, wherein said output transistor and said current-detecting transistor have drains serving as said first output terminals, sources serving as said second output terminals, and gates serving as said control terminals, and said second transistor has two output terminals connected in series between said signal line and said output terminal of said operational amplifier.

26. The current-limiting circuit in accordance with claim 24, wherein said output transistor and said current-detecting transistor have sources serving as said first output terminals, drains serving as said second output terminals, and gates serving as said control terminals, said drain of said output transistor is connected to said electrical load at an end opposed to said first voltage terminal, while the source of said output transistor is connected to said second voltage terminal, said first and second transistors are constituted by PNP type bipolar transistors or P-channel type MOS transistors, and one output terminal of said second transistor is connected to the output terminal of said operational amplifier, and a current path is formed between the other output terminal of said second transistor and said second voltage terminal, and current pull-in means is provided for pulling in current from said signal line to said second voltage terminal by an amount corresponding to the current flowing across said second transistor.

27. The current-limiting circuit in accordance with claim 26, wherein said current pull-in means comprises:

a third transistor-constituted by an NPN type bipolar transistor or an N-channel type MOS transistor, having two output terminals connected in series between said other output terminal of said second transistor and the sources of said output transistor and said current-detecting transistor, and a fourth transistor identical in type and polarity with said third transistor and associated with said third transistor to constitute a secondary current-mirror circuit, having two output terminals connected in series between said signal line and the sources of said output transistor and said current-detecting transistor, so that current flowing from said signal line to said second voltage terminal becomes a predetermined multiple to the current flowing across said third transistor via said second transistor.

28. The current-limiting circuit in accordance with claim 27, further comprising potential-difference producing means for producing an electrical potential difference equivalent to a base-emitter voltage or a gate-source voltage of said third transistor, said potential-difference producing means being interposed between the base or gate of said first and second transistors mutually connected to constitute said current-mirror circuit and the drain of said current-detecting transistor.

29. The current-limiting circuit in accordance with claim 23, wherein said output transistor and said current-detecting transistor are constituted by P-channel type MOS transistors, so as to send out the current flowing across said second transistor to said signal line.

30. The current-limiting circuit in accordance with claim 29, wherein said output transistor and said current-detecting transistor have drains serving as said first output terminals, sources serving as said second output terminals, and gates serving as said control terminals, and said second transistor has two output terminals connected in series between said signal line and said output terminal of said operational amplifier.

31. The current-limiting circuit in accordance with claim 29, wherein said output transistor and said current-detecting transistor have sources serving as said first output terminals, drains serving as said second output terminals, and gates serving as said control terminals, said source of said output transistor is connected to said first voltage terminal, while said drain of said output transistor is connected to said electrical load at an end opposed to said second voltage terminal, said first and second transistors are constituted by NPN type bipolar transistors or N-channel type MOS transistors, and one output terminal of said second transistor is connected to the output terminal of said operational amplifier, and a current path is formed between the other output terminal of said second transistor and said first voltage terminal, and current send-out means is provided for sending out current from said first voltage terminal to said signal line by an amount corresponding to the current flowing across said second transistor.

32. The current-limiting circuit in accordance with claim 31, wherein said current send-out means comprises:

a third transistor constituted by a PNP type bipolar transistor or a P-channel type MOS transistor, having two output terminals connected in series between said other output terminal of said second transistor and the sources of said output transistor and said current-detecting transistor, and a fourth transistor identical in type and polarity with said third transistor and associated with said third transistor to constitute a secondary current-mirror circuit, having two output terminals connected in series between said signal line and the sources of said output transistor and said current-detecting transistor, so that current flowing from said first voltage terminal to said signal line becomes a predetermined multiple to the current flowing across said third transistor via said second transistor.

33. The current-limiting circuit in accordance with claim 32, further comprising potential-difference producing means for producing an electrical potential difference equivalent to a base-emitter voltage or a gate-source voltage of said third transistor, said potential-difference producing means being interposed between the base or gate of said first and second transistors mutually connected to constitute said current-mirror circuit and the drain of said current-detecting transistor.

34. The current-limiting circuit in accordance with claim 23, wherein said output transistor and said current-detecting transistor are bipolar transistors.

* * * * *